United States Patent
Glezer et al.

[11] Patent Number: 6,123,145
[45] Date of Patent: Sep. 26, 2000

[54] SYNTHETIC JET ACTUATORS FOR COOLING HEATED BODIES AND ENVIRONMENTS

[75] Inventors: Ari Glezer; Mark G. Allen, both of Atlanta, Ga.

[73] Assignee: Georgia Tech Research Corporation, Atlanta, Ga.

[21] Appl. No.: 08/970,607

[22] Filed: Nov. 14, 1997

Related U.S. Application Data

[63] Continuation-in-part of application No. 08/489,490, Jun. 12, 1995, Pat. No. 5,758,823.

[51] Int. Cl.⁷ .................................................. F28D 15/00
[52] U.S. Cl. ......................................................... 165/104.33
[58] Field of Search ..................................... 361/699, 695; 165/104.19, 104.33; 417/413, 412

[56] References Cited

U.S. PATENT DOCUMENTS

| | | |
|---|---|---|
| 1,485,715 | 3/1924 | Robinson . |
| 1,878,088 | 9/1932 | Zwikker . |
| 2,498,990 | 2/1950 | Fryklund . |
| 2,591,083 | 4/1952 | Maier . |
| 2,761,833 | 9/1956 | Ward ....................... 222/212 |
| 2,812,636 | 11/1957 | Kadosch . |
| 3,058,014 | 10/1962 | Camp . |
| 3,262,658 | 7/1966 | Reilly ........................ 244/42 |
| 3,361,067 | 1/1968 | Webb . |
| 3,425,058 | 1/1964 | Babington ................. 239/434 |
| 3,985,344 | 10/1976 | McCord . |
| 4,131,505 | 12/1978 | Davis, Jr. . |
| 4,171,852 | 10/1979 | Haentjens . |
| 4,180,377 | 12/1979 | Itakura ...................... 417/413 |
| 4,206,831 | 6/1980 | Welch et al. . |
| 4,261,689 | 4/1981 | Takahashi ................. 417/417 |
| 4,363,991 | 12/1982 | Edelman . |
| 4,369,857 | 1/1983 | Frazer et al. . |
| 4,465,234 | 8/1984 | Maehara et al. . |
| 4,473,185 | 9/1984 | Peterson et al. ............ 239/8 |
| 4,495,947 | 1/1985 | Motycka ..................... 407/413 |

(List continued on next page.)

FOREIGN PATENT DOCUMENTS

| | | |
|---|---|---|
| 3320481 | 12/1984 | Germany . |
| 4-103494 | of 0000 | Japan . |
| 590503 | 11/1974 | U.S.S.R. . |

OTHER PUBLICATIONS

Ingard et al., "Acoustic Nonlinearity of an Orifice," The Journal of Acoustical Society of America, vol. 42, No. 1, 1967, pp. 6–17.

(List continued on next page.)

*Primary Examiner*—Kevin Weldon
*Attorney, Agent, or Firm*—Thomas, Kayden, Horstemeyer & Risley

[57] ABSTRACT

Briefly described, the present invention is concerned with cooling heated bodies and/or heated fluid with synthetic jet actuators in either open or closed systems. A first preferred embodiment of a cooling system of the present invention comprises a synthetic jet actuator directed to impinge directly on a heat producing (or heated) body. The synthetic jet actuator generates a synthetic jet stream comprised of cool ambient fluid that impinges on the heated surface thereby cooling this surface. As an example, the heated surface/body could be a microchip array in a microcomputer. After coming into contact with the heated surface, the fluid moves along the surface and is finally rejected to the ambient where it mixes and cools down. The synthetic jet may be incorporated into a modular unit that may be clipped on to a circuit board or other heat producing element to provide added, 'ad hoc' cooling. In another configuration, a synthetic jet actuator may be positioned, relative to the heated surface, to create a synthetic jet stream to flow along the heated surface. In this embodiment, the flow would be approximately tangential to a surface of a heat producing body. This embodiment may further comprise a cyclical flow of the fluid jet, along the heated body and about a heat sink surface.

17 Claims, 23 Drawing Sheets

U.S. PATENT DOCUMENTS

| | | |
|---|---|---|
| 4,516,747 | 5/1985 | Lurz . |
| 4,533,082 | 8/1985 | Maehara et al. ............................. 239/4 |
| 4,533,255 | 8/1985 | Gronholz et al. . |
| 4,548,240 | 10/1985 | Graham . |
| 4,568,265 | 2/1986 | Firey . |
| 4,611,553 | 9/1986 | Iwata . |
| 4,635,749 | 1/1987 | Tattersall . |
| 4,646,945 | 3/1987 | Stiener et al. ........................... 222/213 |
| 4,667,877 | 5/1987 | Yao et al. . |
| 4,693,201 | 9/1987 | Williams et al. . |
| 4,697,769 | 10/1987 | Blackwelder et al. . |
| 4,702,418 | 10/1987 | Cater et al. ................................. 239/8 |
| 4,747,523 | 5/1988 | Dobbs . |
| 4,798,190 | 1/1989 | Vaznaian et al. . |
| 4,802,642 | 2/1989 | Mangiarotty . |
| 4,930,701 | 6/1990 | Porter et al. . |
| 4,957,783 | 9/1990 | Gabryszewski . |
| 5,034,688 | 7/1991 | Moulene ................................. 361/385 |
| 5,040,560 | 8/1991 | Glezer et al. . |
| 5,102,306 | 4/1992 | Liu ......................................... 417/415 |
| 5,119,840 | 6/1992 | Shibata . |
| 5,121,290 | 6/1992 | Azaz ....................................... 361/794 |
| 5,199,856 | 4/1993 | Epstein et al. . |
| 5,203,362 | 4/1993 | Shibata . |
| 5,238,153 | 8/1993 | Castillo et al. . |
| 5,346,745 | 9/1994 | Bandyopadhyay . |
| 5,365,490 | 11/1994 | Katz . |
| 5,395,592 | 3/1995 | Bolleman et al. . |
| 5,402,312 | 3/1995 | Kinjo ............................. 165/104.33 X |
| 5,411,208 | 5/1995 | Burgener ..................................... 239/8 |
| 5,424,302 | 6/1995 | Abbots . |
| 5,582,348 | 12/1996 | Erickson ..................................... 239/8 |
| 5,621,463 | 4/1997 | Yoshihara . |
| 5,681,152 | 10/1997 | Ahs ...................................... 417/413.2 |
| 5,742,954 | 4/1998 | Idland ...................................... 4/541.1 |
| 5,758,823 | 6/1995 | Glezer et al. . |
| 5,791,601 | 8/1998 | Dancila et al. .......................... 244/207 |

OTHER PUBLICATIONS

Ingard et al., "Acoustic Circulation Effects and the Nonlinear Impedance of Orifices," The Journal of Acoustical Society of America, vol. 22, No. 2, Mar. 1950, pp. 211–218.

Mednikov et al.,"Experimental Study of Intense Acoustic Streaming," Sov. Phys. Acoust., vol. 21, No. 2 Mar.–Apr. 1975, pp. 152–154.

Williams et al., "the Mechanism of Flow Control on a Cylinder with the Unstead Bleed Technique," AIAA 91–0039, Jan. 7–10, 1991.

Coe et al., "Micromachined Jets for Manipulation of Macro Flows," 1994 Solid–State Sensor and Actuator Workshop, Hilton Head, SC.

Hassan et al., "Effects of Zero–Mass "Synthetic" Jets on the Aerodynamics of the NACA–0012 Airfoil," AIAA 97–2326, 199.

AIAA–97–2326, Effects of Zero–Mass "Synthetic' Jets On The Aerodynamics Of The NACA–0012 Airfoil; Ahmed A. Hassan and Ram D. JanakiRam; 1997.

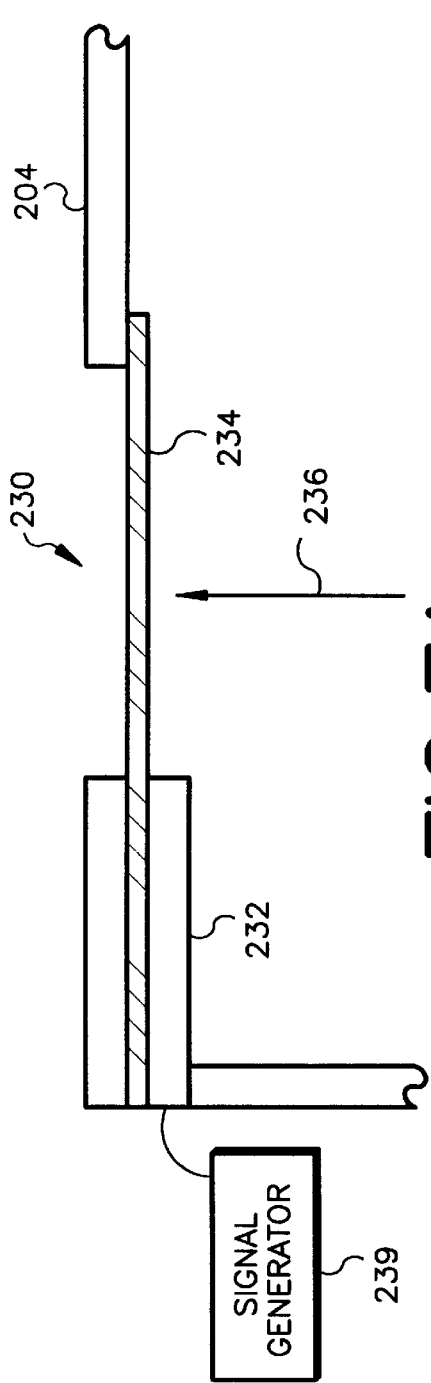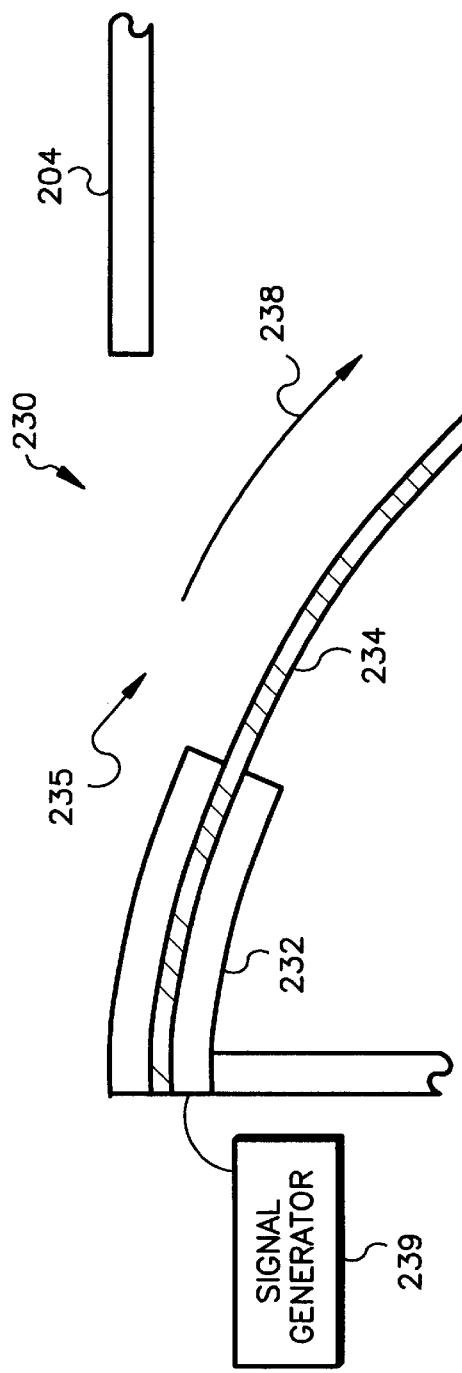
FIG.7A
FIG.7B

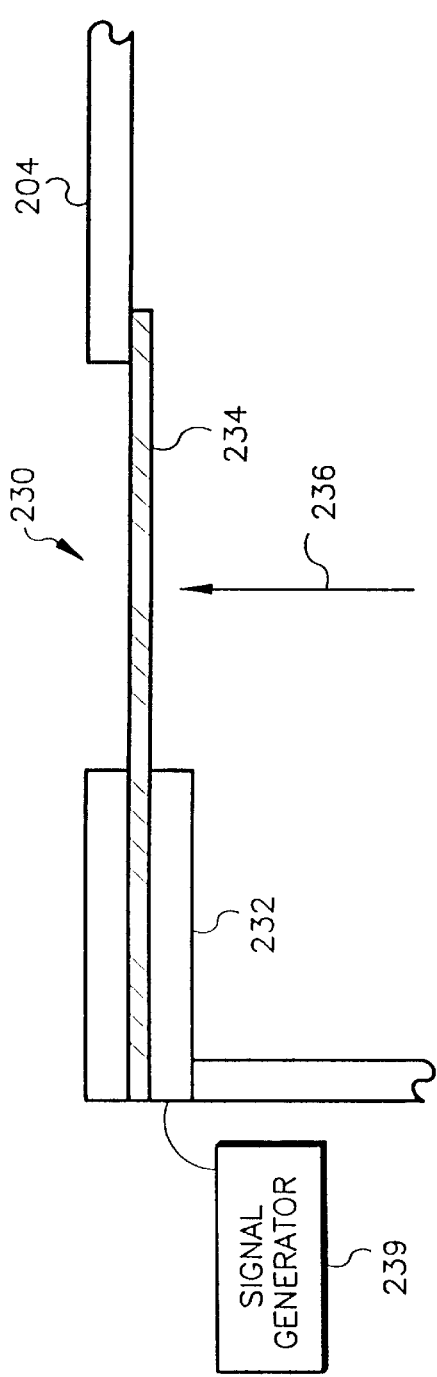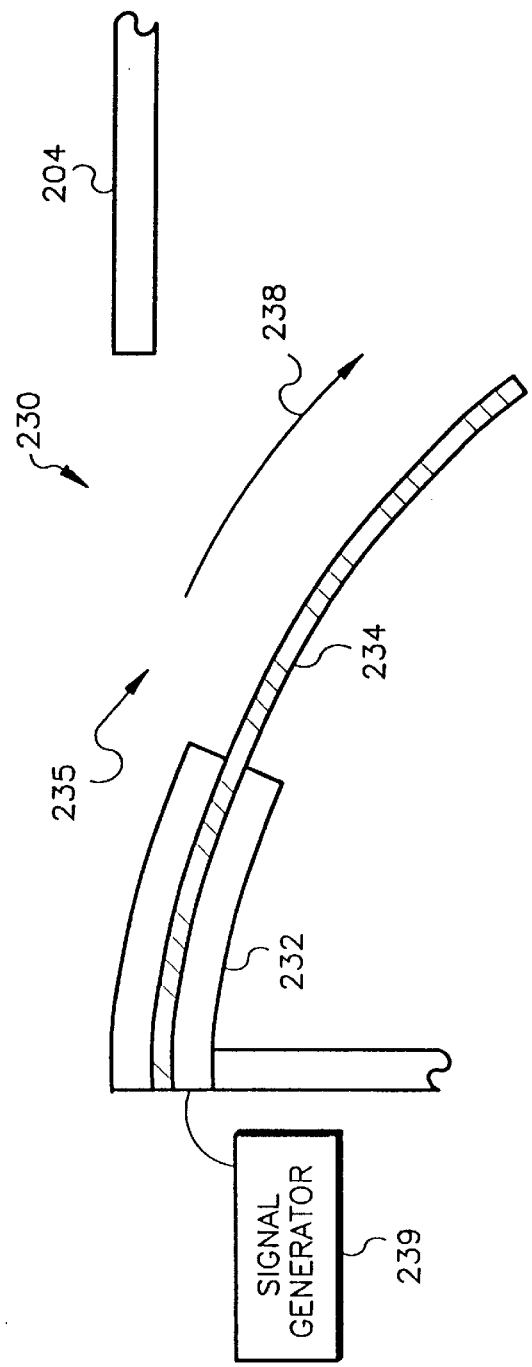
FIG. 20A
FIG. 20B

SYNTHETIC JET ACTUATORS FOR COOLING HEATED BODIES AND ENVIRONMENTS

RELATED APPLICATIONS

This application is a Continuation-In-Part of application Ser. No. 08/489,490, filed on Jun. 12, 1995, now U.S. Pat. No. 5,758,823.

FIELD OF THE INVENTION

The present invention generally relates to fluid actuators for manipulation and control of fluid flow and, more particularly, to a fluid actuator in the form of a synthetic jet actuator adapted to more effectively cool heated bodies and environments.

BACKGROUND OF THE INVENTION

Cooling of heat-producing bodies is a concern in many different technologies. Particularly, a major challenge in the design and packaging of state-of-the-art integrated circuits in single- and multi-chip modules (MCMs) is the ever increasing demand for high power density heat dissipation. While current technologies that rely on global forced air cooling can dissipate about 4 W/cm$^2$, the projected industrial cooling requirements are 10 to 40 W/cm$^2$ and higher within the next five to ten years. Furthermore, current cooling technologies for applications involving high heat flux densities are often complicated, bulky and costly.

Traditionally, this need has been met by using forced convective cooling using fans which provide either global overall cooling or locally-broad cooling when what is often required in pinpoint cooling of a particular component or set of components. Furthermore, magnetic-motor-based fans have the problem of generating electromagnetic interference which can introduce noise into the system.

In applications when there is a heat-producing body in a bounded volume, or "closed system," the problem of cooling the body is substantial. In fact, effective cooling of heated bodies in closed volumes has also been a long standing problem for many designers. Generally, cooling by natural convection is the only method available since forced convection would require some net mass injection into the system, and subsequent collection of this mass. The only means of assistance would be some mechanical fan wholly internal to the volume. However, often this requires relatively large moving parts in order to have any success in cooling the heated body. These large moving parts naturally require high power inputs. But, simply allowing natural convective cooling to carry heat from the body producing it into the fluid of the volume and then depending on the housing walls to absorb the heat and emit it outside the volume is an ineffective means of cooling. The present invention is specifically directed to remedying the many problems in the art by employing specially adapted zero net mass flux synthetic jet actuators to effectively cool in open and closed systems.

Background Technology for Synthetic Jets

It was discovered at least as early as 1950 that if one uses a chamber bounded on one end by an acoustic wave generating device and bounded on the other end by a rigid wall with a small orifice, that when acoustic waves are emitted at high enough frequency and amplitude from the generator, a jet of air that emanates from the orifice outward from the chamber can be produced. See, for example, Ingard and Labate, *Acoustic Circulation Effects and the Nonlinear Impedance of Orifices,* The Journal of the Acoustical Society of America, March, 1950. The jet is comprised of a train of vortical air puffs that are formed at the orifice at the generator's frequency.

The concern of scientists at that time was primarily with the relationship between the impedance of the orifice and the "circulation" (i.e., the vortical puffs, or vortex rings) created at the orifice. There was no suggestion to combine or operate the apparatus with another fluid stream in order to modify the flow of that stream (e.g., its direction). Furthermore, there was no suggestion that the ejection of the vortical puffs and the momentary air stream of "make up" air of equal mass that is drawn back into the chamber can yield effective fluid pumping of surrounding air or liquid near solid surfaces. There was also no suggestion that such an apparatus could be used in such a way as to create a fluid flow within a bounded (or sealed) volume.

Such uses and combinations were not only not suggested at that time, but also have not been suggested by any of the ensuing work in the art. So, even though a crude synthetic jet was known to exist, applications to common problems associated with other fluid flows or with lack of fluid flow in bounded volumes were not even imagined, much less suggested. Evidence of this is the persistence of certain problems in various fields which have yet to be solved effectively.

SUMMARY OF THE INVENTION

Briefly described, the present invention involves improvements to a synthetic jet actuator and its various advances in novel applications of such a synthetic jet actuator. Particularly, the present invention is concerned with cooling heated bodies and heated fluid. The cooling systems described herein can be in either an open or closed system.

Two important attributes of the synthetic jet approach to cooling is that a synthetic jet actuator enables either highly efficient pumping of cool ambient air and redirecting it as an impinging jet on a heated surface in open flow systems or the creation of a flow within a bounded volume. Particularly, effective cooling inside a bounded volume could be achieved without the addition of new species, without the need for a fluid source or drain, and without a mechanical stirring device, which may require a large power input and place additional geometric constraints on the designer. Even if the environment is completely sealed, use of a synthetic jet actuator in heat transfer processes is possible due to the lack of any net mass change caused by the synthetic jet actuator.

I. Construction and Operation of Synthetic Jets

The construction and operation of various synthetic jet actuators will first be described below. These actuators serve as the "hardware" for the present invention and are described in Patent application, Ser. No.: 08/489,490, filed on Jun. 12, 1995, the contents of which are incorporated by reference herein. After discussing synthetic jet actuators generally, several preferred embodiments of a system for cooling with synthetic jet actuators in both open and closed systems will be briefly discussed.

A. First Preferred Embodiment of A Synthetic Jet Actuator

A first preferred embodiment of a synthetic jet actuator comprises a housing defining an internal chamber. An orifice is present in a wall of the housing. The actuator further includes a mechanism in or about the housing for periodically changing the volume within said internal chamber so that a series of fluid vortices are generated and projected in an external environment out from the orifice of the housing. The volume changing mechanism can be any suitable mechanism, for instance, a piston positioned in the jet housing to move so that fluid is moved in and out of the orifice during reciprocation of the piston. Preferably, the volume changing mechanism is implemented by using a flexible diaphragm as a wall of the housing. The flexible diaphragm may be actuated by a piezoelectric actuator or other appropriate means.

Typically, a control system is utilized to create time-harmonic motion of the diaphragm. As the diaphragm moves into the chamber, decreasing the chamber volume, fluid is ejected from the chamber through the orifice. As the fluid passes through the orifice, the flow separates at the sharp edges of the orifice and creates vortex sheets which roll up into vortices. These vortices move away from the edges of the orifice under their own self-induced velocity.

As the diaphragm moves outward with respect to the chamber, increasing the chamber volume, ambient fluid is drawn from large distances from the orifice into the chamber. Since the vortices are already removed from the edges of the orifice, they are not affected by the ambient fluid being entrained into the chamber. As the vortices travel away from the orifice, they synthesize a jet of fluid, a "synthetic jet," through entrainment of the ambient fluid.

In addition to the basic design of a synthetic jet actuator, one may modify the design to enhance performance. This enhanced synthetic jet actuator comprises a housing defining an interior chamber and an orifice in one wall of the housing. The synthetic jet actuator has a device or mechanism for withdrawing fluid into the chamber and for forcing fluid out of the chamber through the orifice. At least one louver is attached to the housing and is aligned with an opening formed in the housing. The louver is a one-way valve and only permits fluid flow in one direction. Thus, the louver permits fluid flow either into the chamber through the opening or out of the chamber through the opening.

The operation of the enhanced synthetic jet actuator can vary greatly depending upon whether the louver permits fluid to flow into the chamber or instead only permits fluid to flow out of the chamber. If the louver permits fluid flow into the chamber, then the synthetic jet actuator is able to withdraw fluid into the chamber through a greater surface area. The force of the jet expanded by the synthetic jet actuator, however, is not decreased since all of the fluid exits the chamber through the orifice. The synthetic jet actuator with this configuration can operate at fairly high speeds. Alternatively, if the louver only permits fluid to flow out of the chamber, then the synthetic jet actuator will generate a greater fluid flow into the chamber through the orifice than the flow out of the orifice.

A synthetic jet actuator may have any suitable louver and any suitable mechanism or device for withdrawing fluid into the chamber and for forcing fluid out of the chamber. For instance, the louver may be a passive louver or an active louver, such as one whose position is at least partially controlled by a piezoelectric material. The device or mechanism may comprise a piston reciprocating within the chamber or may comprise a flexible diaphragm driven by piezoelectric actuation.

B. Second Preferred Embodiment of a Synthetic Jet Actuator

The synthetic jet actuator just described is not the only device capable of forming a synthetic jet stream. Indeed, there are several ways to build a synthetic jet actuator for use with the present invention. For example, in certain applications a constant suction synthetic jet actuator may be desirable. In this preferred embodiment, a synthetic jet actuator will typically be embedded in a body and operate through the outer surface of the body. There may be no room in the body for a piston or other volume changing means suggested by the first preferred embodiment. This second preferred embodiment provides a solution to such a potential problem.

For the second preferred embodiment of a synthetic jet actuator, there are two concentric tubular sections, or pipes, embedded in the solid body, normal to the outside surface. The outer of the two pipes is preferably connected to a source of fluid with a means for pulsing a fluid out of this pipe. The innermost of the two pipes is connected to an appropriate means for pulling fluid down this pipe from the ambient fluid above the planar surface, such as a vacuum or fluid pump. Situated such that its exit plane is slightly below the planar surface, in operation, the innermost pipe constantly pulls fluid down its length from the ambient fluid above the flat, planar surface. Meanwhile, the outer pipe is caused to pulse fluid into the ambient environment above the planar surface. Such an operation will cause a synthetic fluid jet to form above the constant suction synthetic jet actuator.

Additionally, this embodiment allows a user to tailor the net mass flux into the system caused by the synthetic jet actuator. The source of fluid could be a compressor or other source separate from the depository of the fluid drawn into the innermost pipe. One could, therefore, tailor the system to yield a net mass increase, decrease, or no net mass flux into or out of the system above the synthetic jet actuator.

II. Applications Of Synthetic Jets To Cooling In Open And Closed Systems

The devices capable of forming synthetic jets, and the improvement of using louvers, all have certain features common to the class of synthetic jets that permit more effective cooling, and particularly, cooling in sealed environments. A brief description of the novel apparatus and process to which the present invention is directed follows.

An object of the present novel cooling system is to provide cooling mechanisms that will provide "on-the-spot" (and on demand) high heat flux cooling and will be implemented in low-profile, compact, reliable and inexpensive packages.

An additional object is to keep the power requirements of this device modest, while permitting the device to be completely interfaceable with the power supplies of a variety of electronic equipment which will ultimately be cooled.

An additional object is to provide an embodiment of such a cooling apparatus which is available in a package that can be "clipped" onto electronic boards in an 'ad hoc' fashion, preferably in the field, so that unforeseen cooling problems for equipment in the field can be fixed "on-the-spot."

A. Cooling In An Open System

The fundamental concept in open system cooling is that the synthetic jet acts as a combination of a pump and a jet. The jet draws cool ambient fluid towards the jet orifice. The action of the membrane is to draw this fluid into the jet cavity and then emit the fluid as a highly directional jet. This jet, in turn, is made to impinge on a heated surface thereby cooling this surface. The heated fluid moves along the surface and is finally rejected to the ambient where it mixes and cools down. Proper channeling or ducting insures that the cool ambient fluid and the rejected heated fluid are not the same to prevent a "short circuit."

Alternatively, the jet hardware can be placed in the center of the heated surface thus drawing cool ambient air along the heated surface and cooling it and then using the jet to reject the heated air away from the surface and back into the ambient.

It is important to recognize that in either configuration this methodology could also be used to heat up a cool object in a hot ambient.

A first preferred embodiment for a synthetic jet actuator cooling system is to draw cool fluid towards the jet and impinge a cool jet on a heated surface. A typical embodiment of such a system is where one wall of an enclosure comprises an apparatus which emits heat. As an example, this heat emitting apparatus could be a microchip array in a microcomputer. In this case, the synthetic jet actuator could be directed at the heat-emitting apparatus and fluid impinge upon the heat-producing body. A synthetic jet stream of fluid impinging on the apparatus would be far more effective at cooling the apparatus than natural convection cooling.

As a specific example of cooling by direct impingement, a "clip-on" module can be constructed to cool electronic parts. Such a "clip-on" module exhibits all the benefits of synthetic jet actuator cooling, additionally however, the device is manufactured such that it can be attached to any existing system in need of spot cooling. A "clip-on" module typically comprises a housing defined by walls and forming an internal chamber where one of the walls forms an orifice. Preferably, an interior flexible membrane is attached to the housing walls such as to bisect the chamber into a control chamber and a jet chamber. In this way, the orifice permits fluid interaction between the jet chamber and an external environment having an ambient fluid. Preferably, control circuitry causing periodic motion of the flexible membrane is housed in the control chamber. Clamp arms of any desired length are rigidly attached to an external portion of the housing walls and comprise clamps on their unattached ends. These clamp arms permit the entire cooling system to be "clamped" onto or about the surface to be heated. Alternatively, the system could be clamped to any other surface such that the fluid emitting from the orifice impinges upon or flows along the heated body or area. The components of the "clip-on" module comprising the membrane, housing walls, and orifice function just as the basic synthetic jet actuators described above. Special ducting insures that the cooling air and the heated air are kept separate and do not mix.

A second preferred embodiment of a system for cooling a heat producing body, synthetic jet actuators can be used to create fluid flow in and through a channel along the walls of the channel. In the preferred embodiment, a synthetic jet actuator could be placed in one wall of a channel in the object to be cooled. Note that, as an alternative, the body having the channel could comprise a heat sink. Arrangements are made to enable the jet to reject the fluid to the ambient through a port in the channel. In either situation, when operational, the synthetic jet actuator at the bottom of the channel would produce a stream of fluid traveling through the center of the channel. Because a synthetic jet actuator creates zero net change in system mass, the fluid to fill the synthetic jet chamber must originate from the ambient fluid of the system in which the synthetic jet operates. But in order for fluid to reach the chamber of the synthetic jet actuator, it must travel down the channel and through the orifice. However, the synthetic jet is sending a stream of fluid up the center of the channel and into the ambient through a port. Therefore, the fluid being drawn toward the chamber travels down the walls of the channel to reach the synthetic jet orifice. This process allows excellent heat transfer along the channel walls.

B. Cooling In A Closed System

As mentioned above, in contrast to conventional fluid jets, a unique feature of synthetic jet actuators is that they are synthesized from the working fluid of the flow system in which they are deployed. Therefore, synthetic jet actuators may be used to create fluid flows in bounded volumes, where conventional jets could not be effectively used for such an application. Such fluid flows could act as convectors of heat energy or ionic species. An example would be electrochemistry applications. In particular, synthetic jet actuators in bounded volumes are extremely effective in mixing the working fluid and thereby transporting heat away from solid surfaces in the bounded volume. In addition, chemical species could be mixed. As an example, using chemical reactions assisted by mixing to absorb heat. Although equally true in open flow systems, synthetic jet actuators in constrained systems do not need any complex piping to function and do not inject any fluid into the system. This is in addition to the low energy requirements and the fact that other types of jets are, by their very nature, undesirable in bounded volume situations due to their required injection of fluid/mass.

A specific application and preferred embodiment of this technology involves a synthetic jet actuator aimed to flow along a heated body or surface, the flow being approximately tangential to a surface of a heat producing body. Typically, this embodiment will involve a cyclical flow of a jet of fluid, along the heated body and about a heat sink surface. The heat sink surface may even protrude out of the sealed volume in which the jet is enclosed. Alternatively as mentioned above, this preferred embodiment could be easily adapted to transport ions away from the surface or mix chemicals. Of course, cooling in a closed system may be accomplished also by causing a jet of fluid to directly impinge upon the heated body.

As mentioned above, the "clip-on" module or other appropriate direct impingement cooling system could be also employed in a closed system. Additionally, a "low profile" design may be desired. In this configuration, a synthetic jet actuator is constructed to project fluid across, instead of impinging on a heated surface or area. This configuration takes advantage of the strong entrainment of ambient fluid created by synthetic jet actuators.

In summary, there are many advantages to using a synthetic jet actuator to cool an object in a bounded volume. First, the object will be cooled more effectively by the forced convection that the synthetic jet allows than by natural convection. The cooling efficiency is also greatly increased compared to a conventional jet having the same momentum because the synthetic jet is highly unsteady and comprised individual vortices thus allowing for very efficient heat transfer. Also, the synthetic jet actuator will be very effective at cooling the surface without employing any complex piping and without injection of fluid into the system. Very low power input is required to run a synthetic jet actuator relative to the power required for any other cooling system. Finally, there is no need for any mass injection into the bounded volume system.

Other features and advantages will become apparent to one with skill in the art upon examination of the following drawings and detailed description. All such additional features and advantages are intended to be included herein within the scope of the present invention, as is defined by the claims.

BRIEF DESCRIPTION OF THE DRAWINGS

The present invention can be better understood with reference to the following drawings. The drawings are not necessarily to scale, emphasis instead being placed upon clearly illustrating principles of the present invention. Moreover, like reference numerals designate corresponding parts throughout the several views.

FIG. 20A is a schematic cross-sectional side view of an active louver in a closed position.

FIG. 20B is a schematic cross-sectional side view of the active louver of FIG. 20A in an open position.

DETAILED DESCRIPTION OF THE PREFERRED EMBODIMENTS

It will be obvious to those skilled in the art that many modifications and variations may be made to the preferred embodiments of the present invention as described hereafter without substantially departing from the spirit and scope of the present invention. All such modifications and variations are intended to be included herein within the scope of the present invention, as is set forth in the appended claims. As above, synthetic jet actuators generally, will be described first. These actuators are merely the "hardware" used in the present invention. Thereafter, the preferred embodiments of the present invention will be described in detail.

I. Synthetic Jet Actuator Hardware

A. First Preferred Embodiment For Synthetic Jet Actuators

Figure 1A:
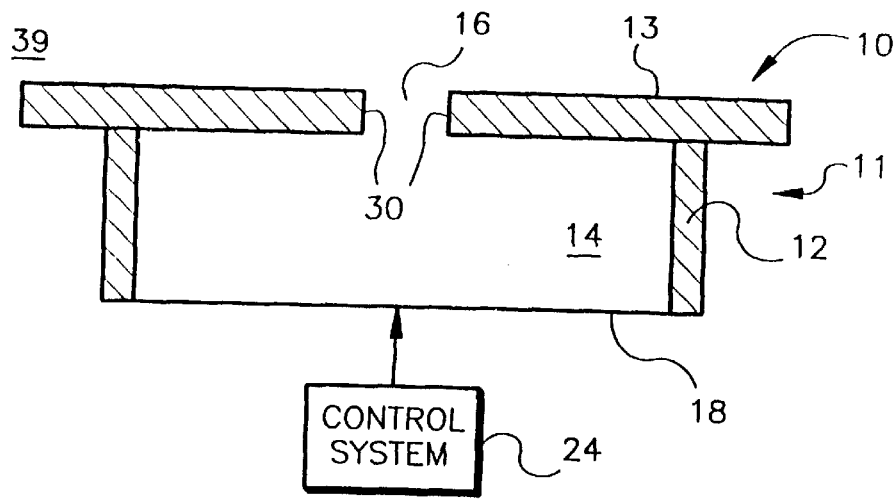
FIG. 1A is a schematic cross-sectional side view of a zero net mass flux synthetic jet actuator with a control system.

FIG. 1A depicts a synthetic jet actuator 10 comprising a housing 11 defining and enclosing an internal chamber 14. The housing 11 and chamber 14 can take virtually any geometric configuration, but for purposes of discussion and understanding, the housing 11 is shown in cross-section in FIG. 1A to have a rigid side wall 12, a rigid front wall 13, and a rear diaphragm 18 that is flexible to an extent to permit movement of the diaphragm 18 inwardly and outwardly relative to the chamber 14. The front wall 13 has an orifice 16 of any geometric shape. The orifice diametrically opposes the rear diaphragm 18 and connects the internal chamber 14 to an external environment having ambient fluid 39.

The flexible diaphragm 18 may be controlled to move by any suitable control system 24. For example, the diaphragm 18 may be equipped with a metal layer, and a metal electrode may be disposed adjacent to but spaced from the metal layer so that the diaphragm 18 can be moved via an electrical bias imposed between the electrode and the metal layer. Moreover, the generation of the electrical bias can be controlled by any suitable device, for example but not limited to, a computer, logic processor, or signal generator. The control system 24 can cause the diaphragm 18 to move periodically, or modulate in time-harmonic motion, and force fluid in and out of the orifice 16.

Alternatively, a piezoelectric actuator could be attached to the diaphragm 18. The control system would, in that case, cause the piezoelectric actuator to vibrate and thereby move the diaphragm 18 in time-harmonic motion. The method of causing the diaphragm 18 to modulate is not limited by the present invention.

Figure 1B:
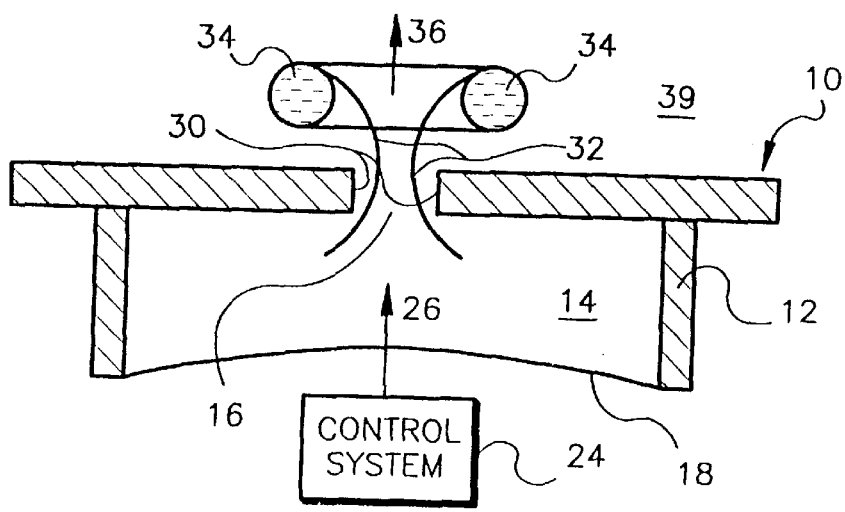
FIG. 1B is a schematic cross-sectional side view of the synthetic jet actuator of FIG. 1A depicting the jet as the control system causes the diaphragm to travel inward, toward the orifice.

The operation of the synthetic jet actuator 10 will now be described with reference to FIGS. 1B and 1C. FIG. 1B depicts the synthetic jet actuator 10 as the diaphragm 18 is controlled to move inward into the chamber 14, as depicted by arrow 26. The chamber 14 has its volume decreased and fluid is ejected through the orifice 16. As the fluid exits the chamber 14 through the orifice 16, the flow separates at sharp orifice edges 30 and creates vortex sheets 32 which roll into vortices 34 and begin to move away from the orifice edges 30 in the direction indicated by arrow 36.

Figure 1C:
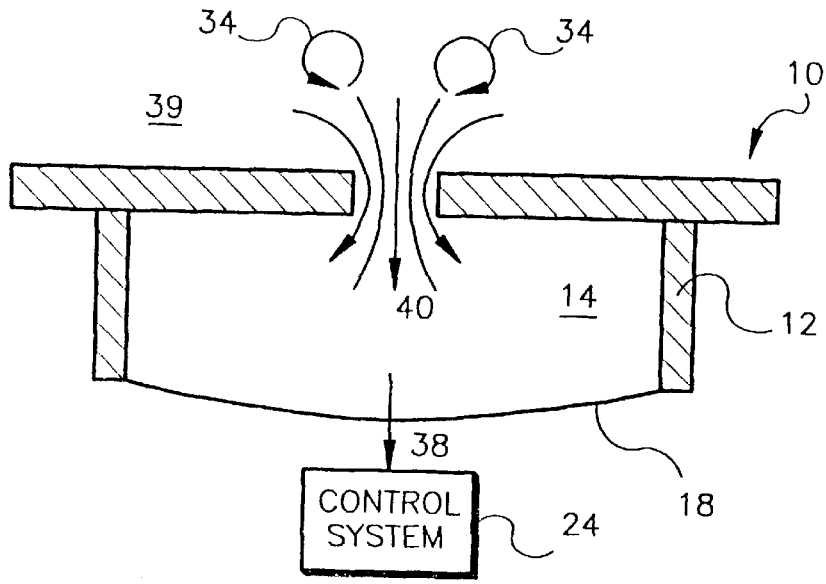
FIG. 1C is a schematic cross-sectional side view of the synthetic jet actuator of FIG. 1A depicting the jet as the control system causes the diaphragm to travel outward, away from the orifice.
Figure 2A:
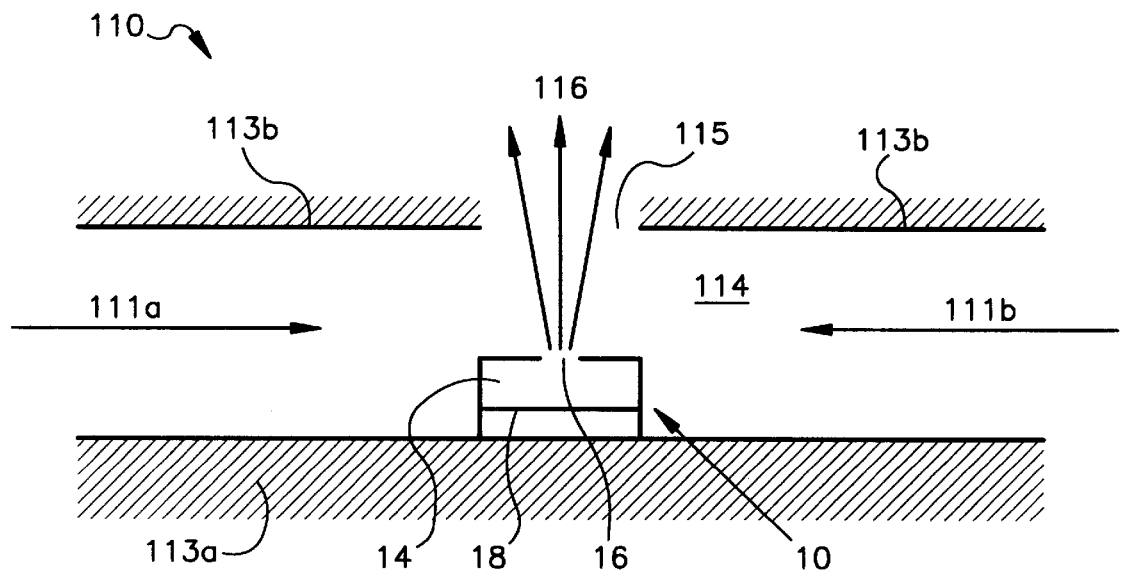
Figure 2B:
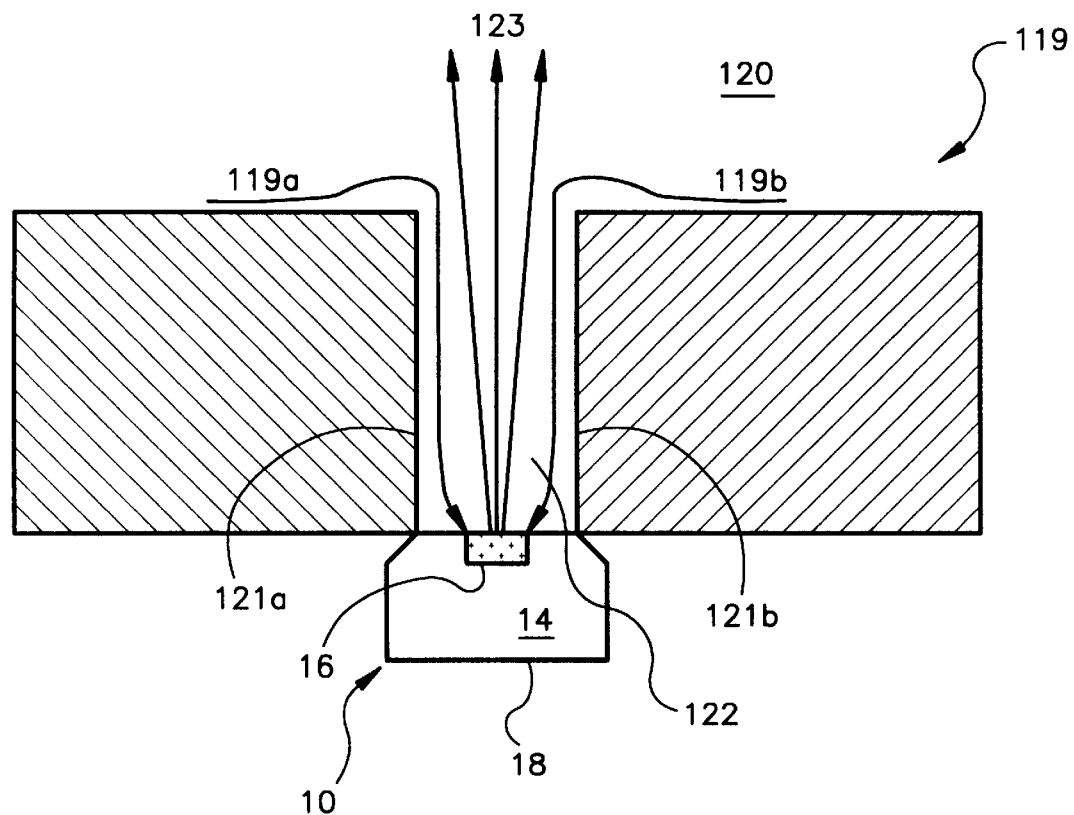
Figure 3A:
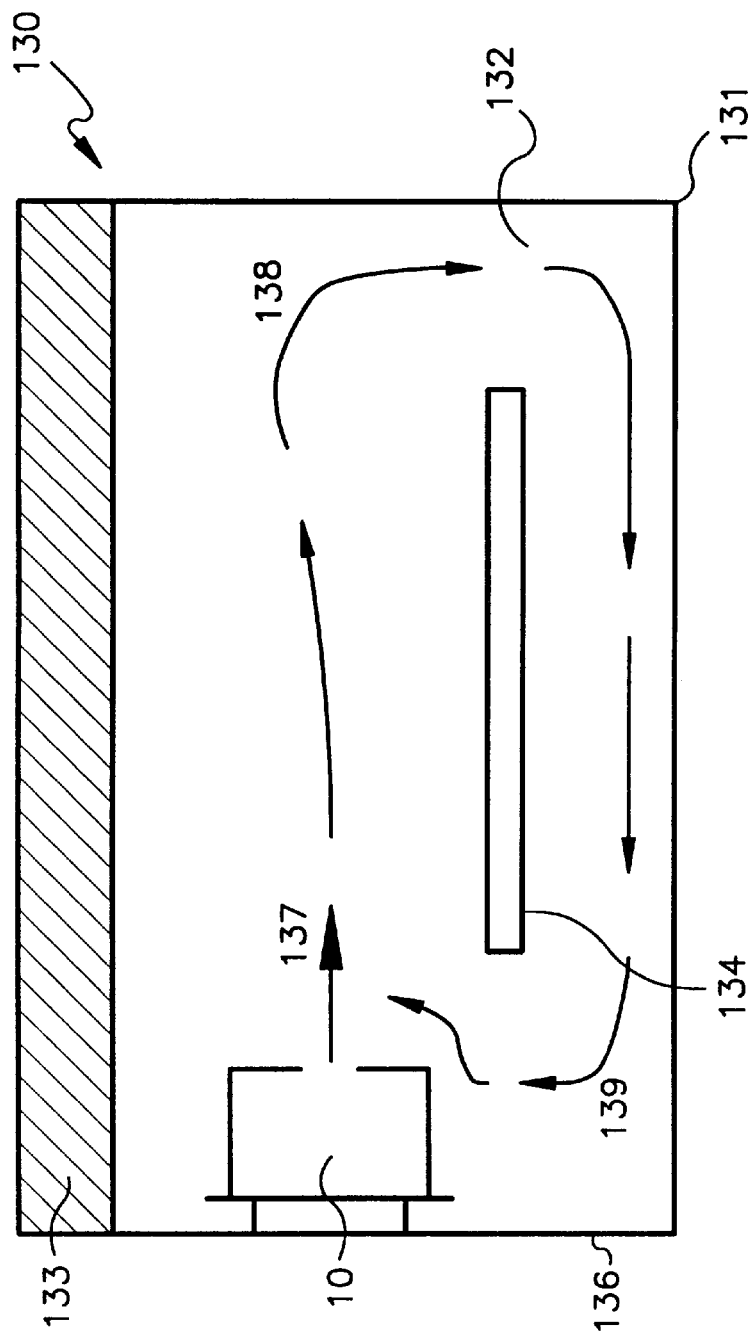
Figure 3B:
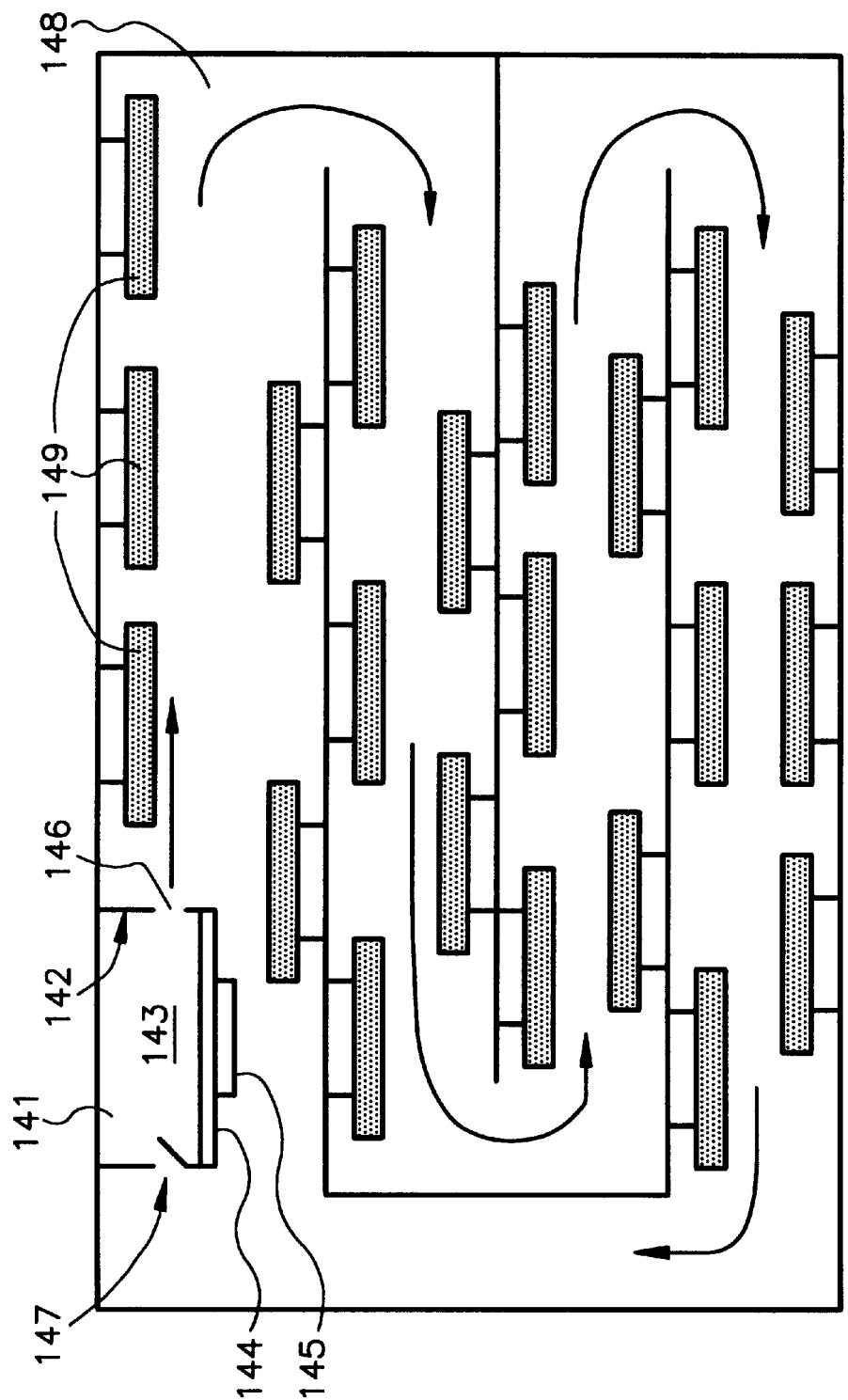
Figure 4A:
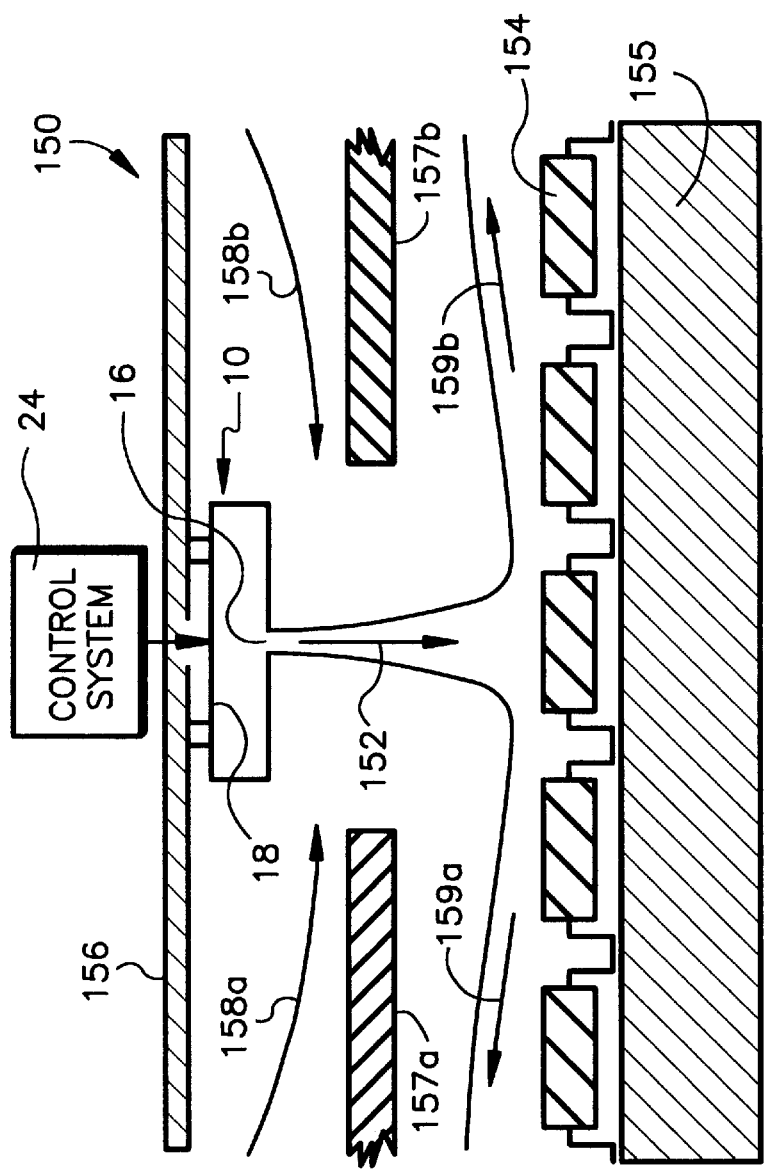
Figure 4B:
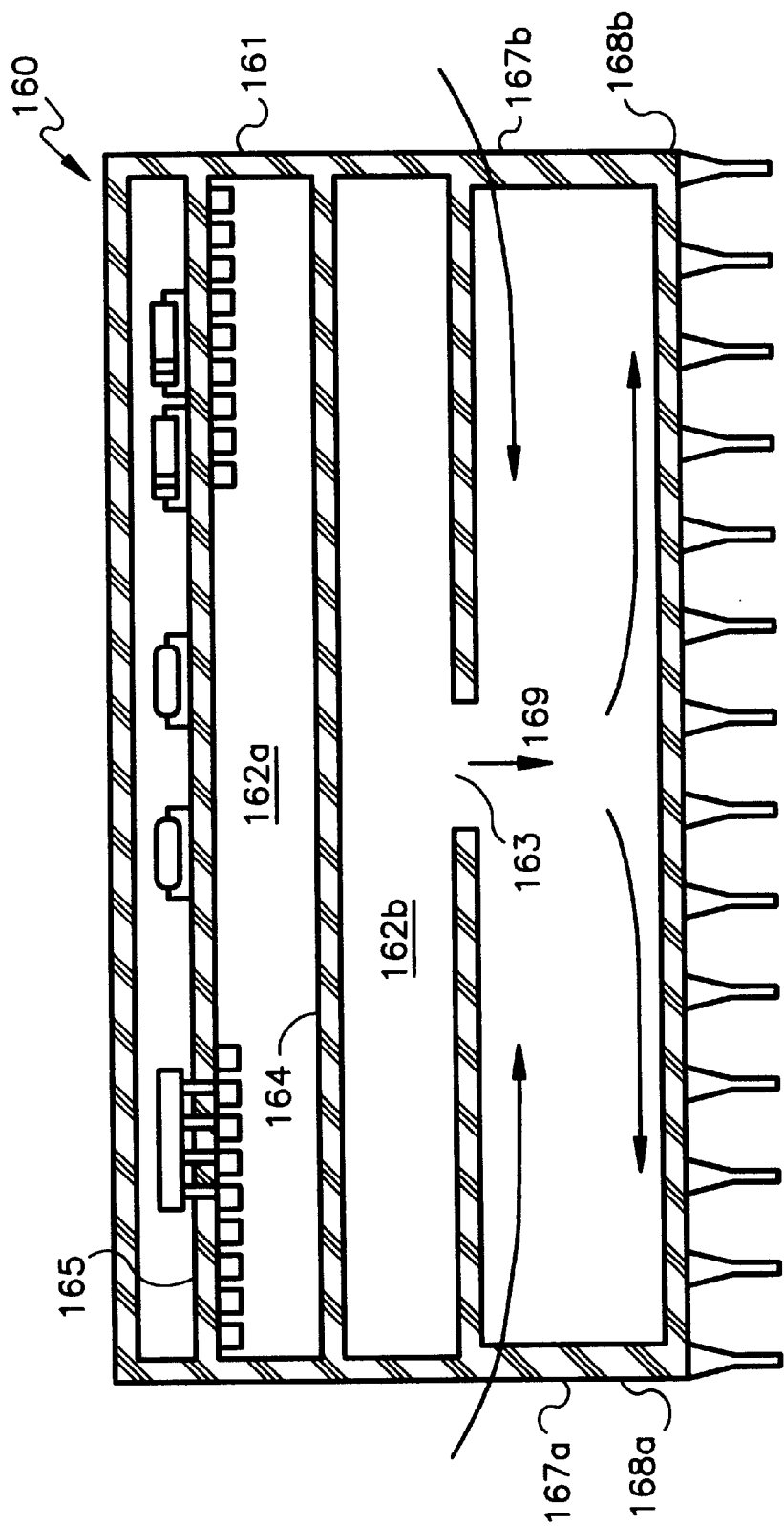
Figure 5A:
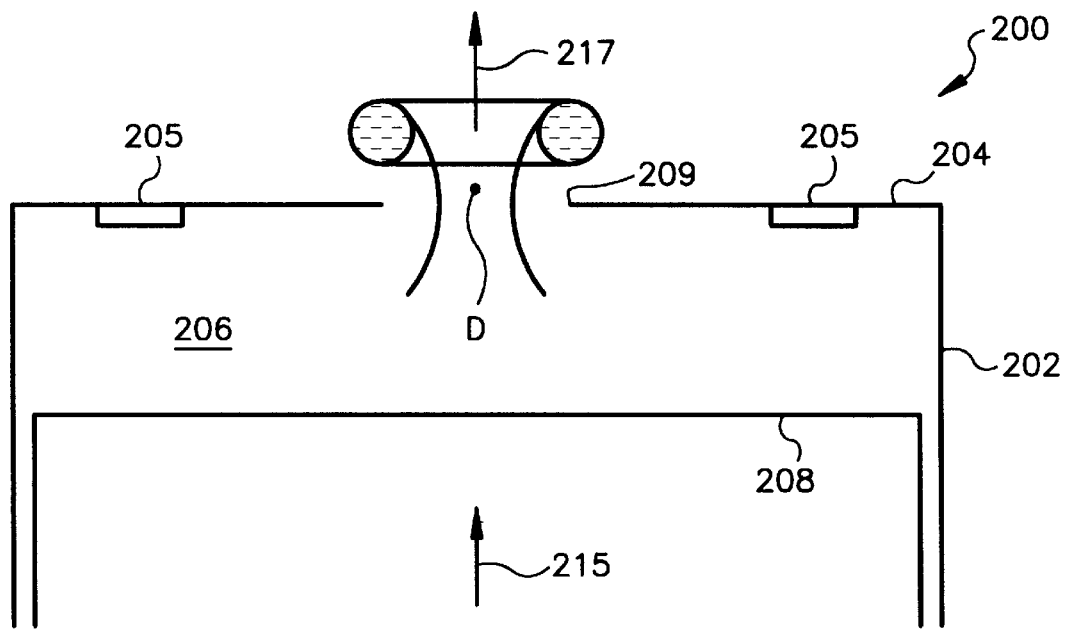
Figure 5B:
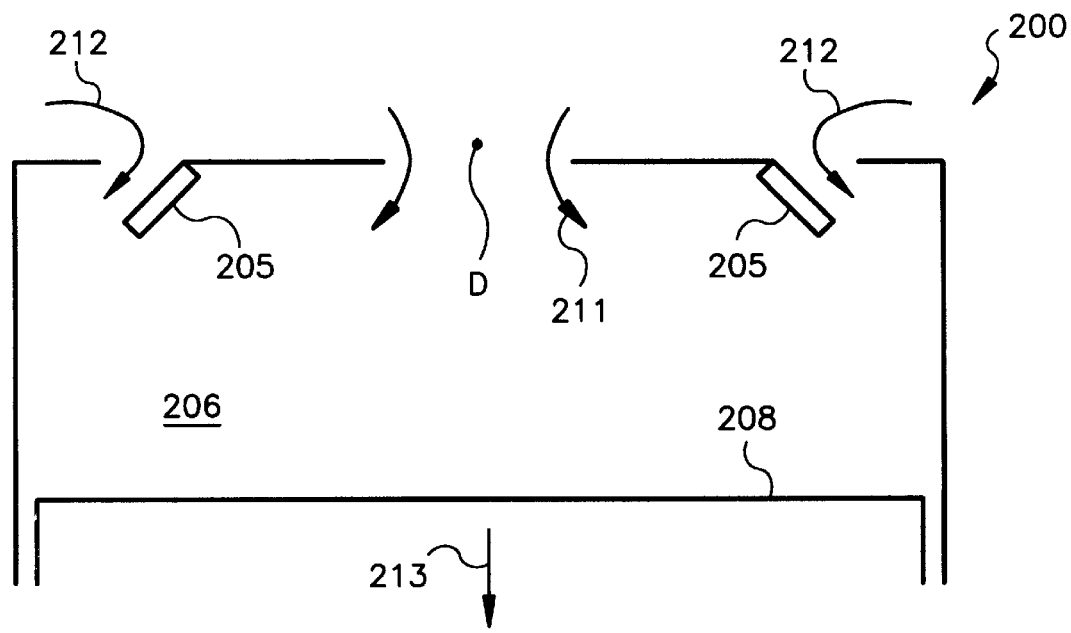
Figure 6A:
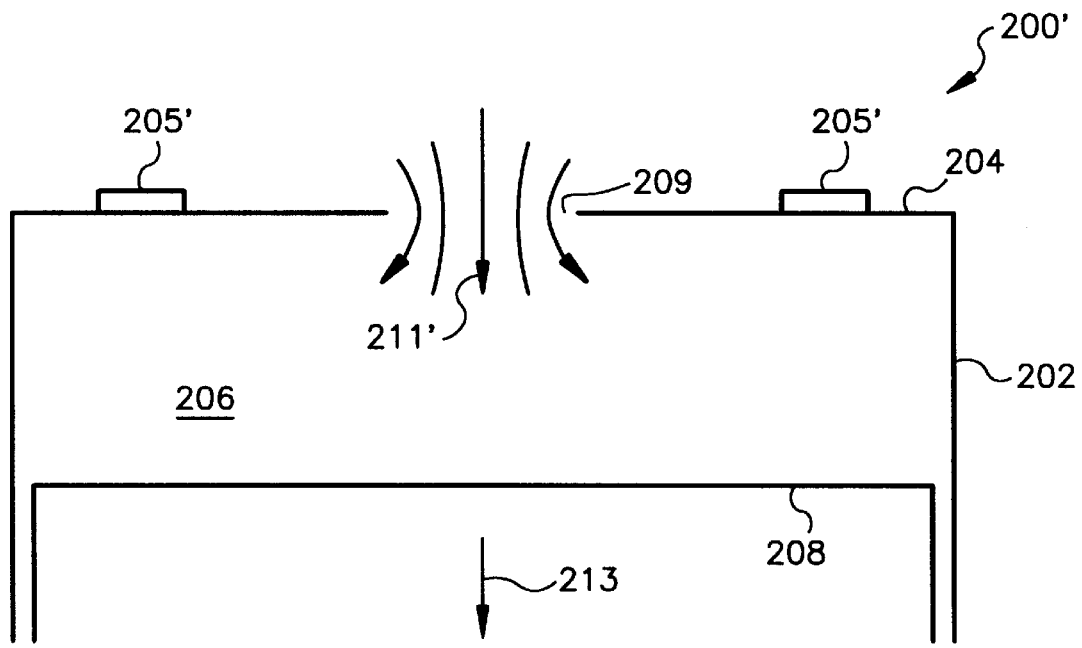
Figure 6B:
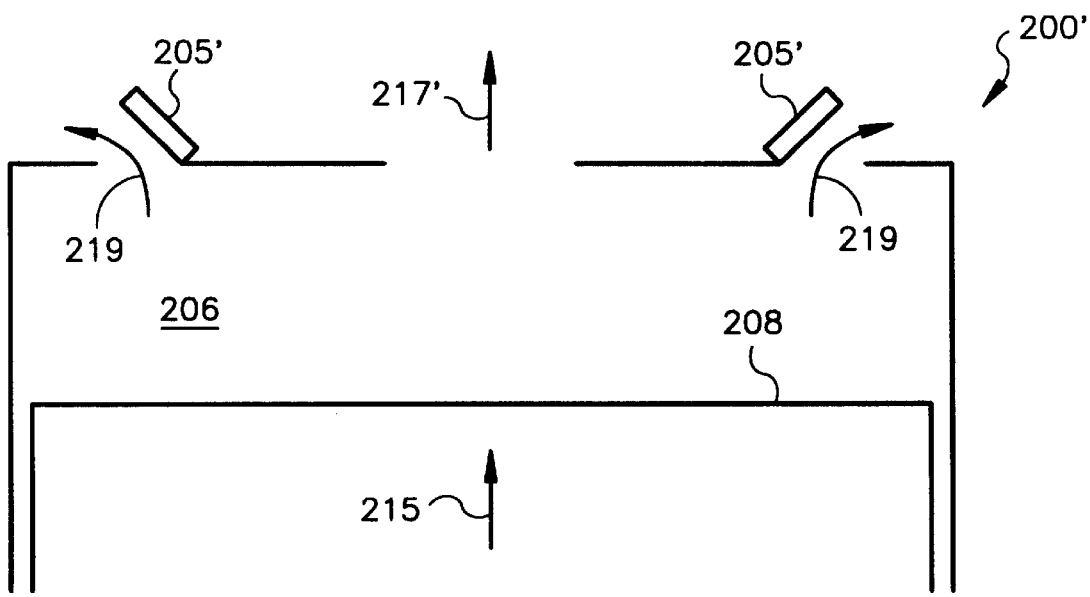
Figure 8:
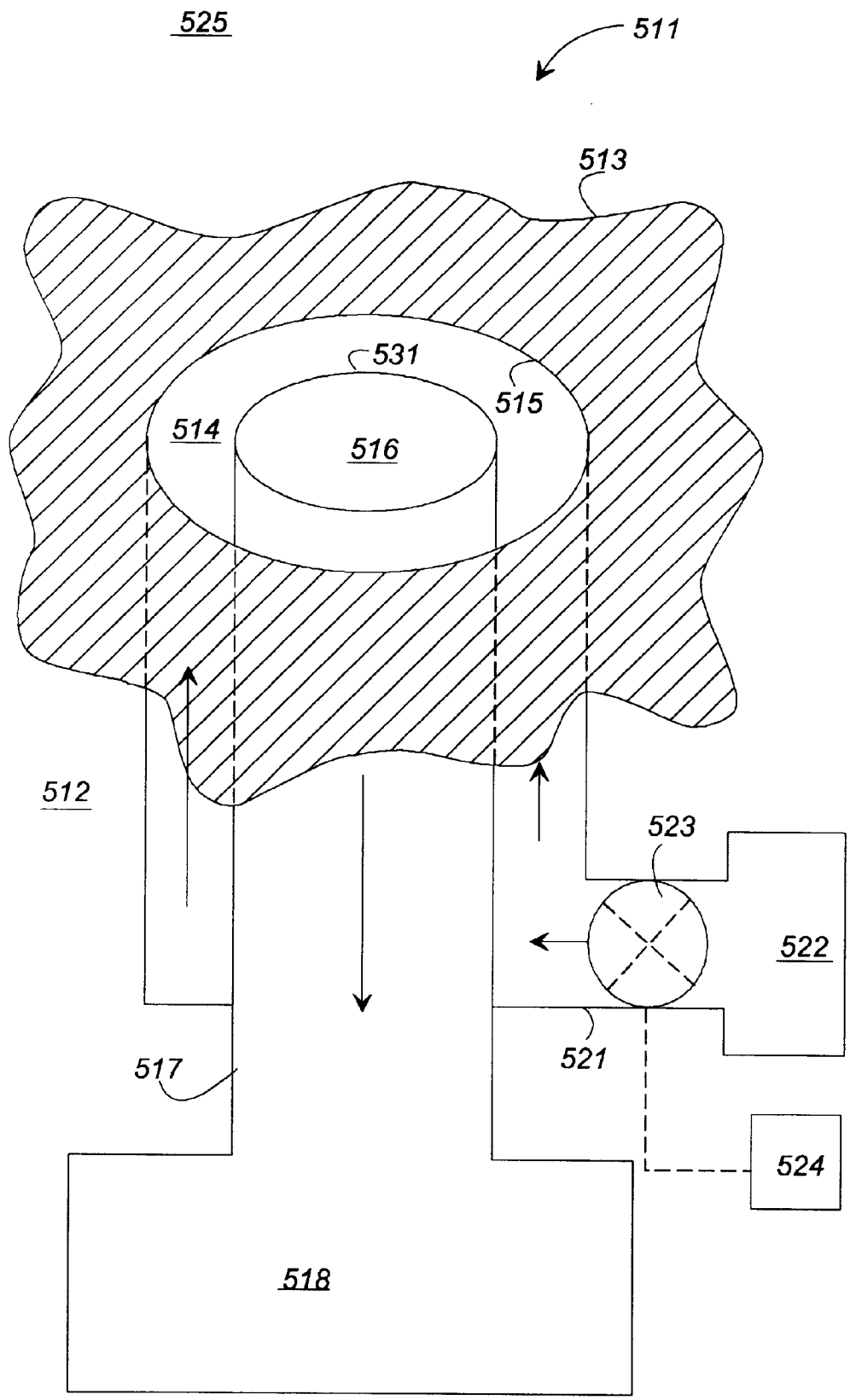

FIG. 1C depicts the synthetic jet actuator 10 as the diaphragm 18 is controlled to move outward with respect to the chamber 14, as depicted by arrow 38. The chamber 14 has its volume increased and ambient fluid 39 rushes into the chamber 14 as depicted by the set of arrows 40. The diaphragm 18 is controlled by the control system 24 so that when the diaphragm 18 moves away from the chamber 14, the vortices 34 are already removed from the orifice edges 30 and thus are not affected by the ambient fluid 39 being drawn into the chamber 14. Meanwhile, a jet of ambient fluid 39 is synthesized by the vortices 34 creating strong entrainment of ambient fluid drawn from large distances away from the orifice 16.

The features and operation of synthetic jet actuators, generally are described in detail in patent application Ser.

No. 08/489,490, filed Jun. 12, 1995. The present application is a continuation-in-part of application Ser. No. 08/489,490. Application Ser. No. 08/489,490, filed Jun. 12, 1995, is hereby incorporated by reference in this application as if fully set out herein.

B. Modification of the First Preferred Embodiment: Synthetic Jets with Louvers In the first preferred embodiment, the synthetic jet actuator 10 had a flexible diaphragm 18 for forcing fluid into and out of a chamber 14. The flexible diaphragm 18 is described as being controlled by a control system 24 which may comprise, inter alia, a processor or logic circuitry. The synthetic jet actuator, however, is not limited to the use of just a flexible diaphragm. For instance, in some applications, a moveable piston head may be preferred. In these applications, the piston head would be positioned within the chamber 14 opposite the orifice 16 and would be moved by any suitable mechanism, such as a piston rod, so as to reciprocate within the chamber 14.

As opposed to the flexible diaphragm 18, the piston head would be able to move a larger mass of fluid and thus be able to produce fluid flows having larger momentums. With these stronger fluid flows, the synthetic jet actuator 10 in turn may operate more effectively in vectoring primary fluid flows, in altering aerodynamic surfaces, in promoting mixing of fluids, and in aiding heat transfer to or from a fluid. The use of a piston rather than the flexible diaphragm 18 will have other advantages and benefits which will be apparent to those skilled in the art.

A synthetic jet actuator, such as actuator 10 shown in FIGS. 1A to 1C, can be modified to operate more efficiently at very high speeds. At a very high speed, after the fluid is forced out of the chamber 14 through the orifice 16, the diaphragm 18 or piston then quickly begins to move away from the orifice 16 and attempts to draw fluid back into the chamber 14. A limitation on the withdrawal of fluid back into the chamber 14 can decrease the force of the jet 36 and the effectiveness of the jet actuator 10. Furthermore, if the fluid is compressible, the quick retraction of the flexible diaphragm 18 creates a vacuum within the chamber 14. As a result, the fluid that is drawn into the chamber 14 has less mass than that previously forced out of the chamber 14 and the subsequent jet 36 will, consequently, have less momentum. The inability to force an adequate mass of fluid into the chamber 14 therefore decreases the effectiveness of the jet actuator 10.

Figure 17A:
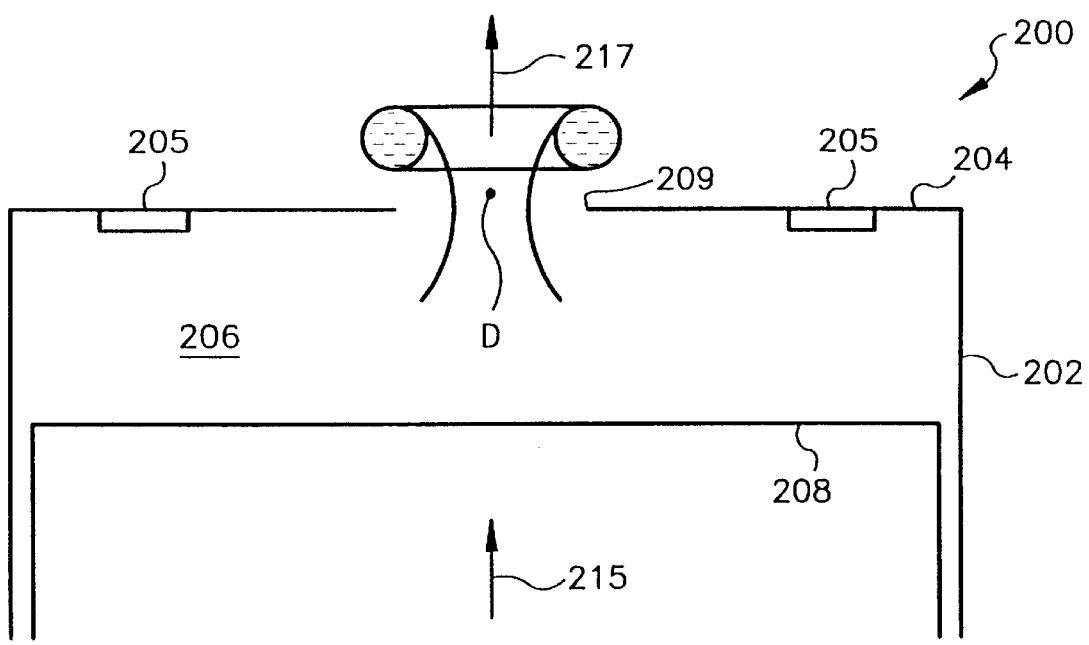
FIG. 17A is a schematic cross-sectional side view of a synthetic jet actuator having a pair of outwardly-opening louvers in a closed position while a piston moves away from an orifice.
Figure 17B:
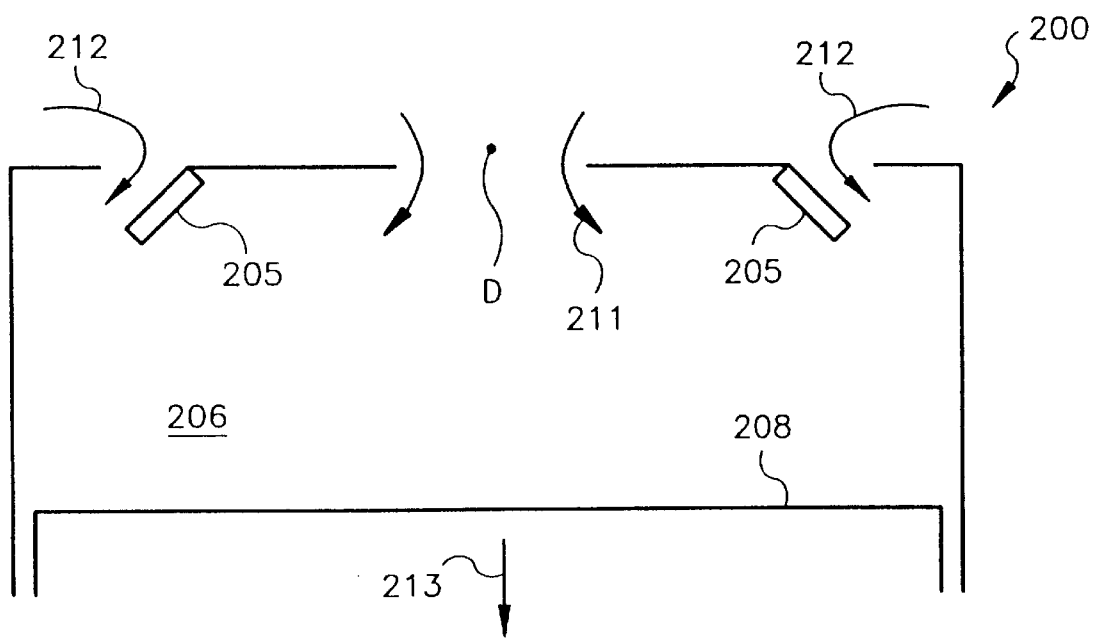
FIG. 17B is a schematic cross-sectional side view of the synthetic jet actuator of FIG. 17A illustrating the louvers in an open position while the piston moves toward the orifice.

A synthetic jet actuator 200 which can effectively operate at high speeds is shown in FIGS. 17A and 17B and comprises a housing 202 defining an interior chamber 206. The housing 202 has an upper wall 204 with an orifice 209 and at least one louver 205. In the preferred embodiment, the jet actuator 200 preferably has a plurality of louvers 205. Only two louvers 205 have been shown in the figures in order to simplify the description. The synthetic jet actuator 200 also comprises a piston head 208 for reciprocating toward and away from the orifice 209 at a prescribed rate and stroke distance. The invention is not limited to any particular stroke distance or rate whereby the rate and stroke distance may be adjusted according to the particular needs of an application.

FIG. 17A illustrates the jet actuator 200 at a time when the piston 208 is moving toward the orifice 209. As shown in the figure, the louvers 205 are in a closed position whereby a fluid flow 217 is forced out only through the orifice 209. The jet 217 produced by the jet actuator 200 is similar to the jet 36 produced by the jet actuator 10 and produces vortex sheets which roll into vortices and move away from the orifice 209.

With reference to FIG. 17B, the louvers 205 open during the time that the piston 208 moves away from the orifice 209. With the louvers 205 opened, fluid may enter the chamber 206 not only through the orifice 209 in flow 211 but also through the openings adjacent to the louvers 205 in flows 212. These additional fluid flows 212 substantially increase the surface area by which fluid may enter the jet actuator 200 and enable the jet actuator 200 to force a sufficient amount of fluid into the chamber 206 while the piston 208 moves away from the orifice 209. Since the jet actuator 200 is able to intake sufficient amounts of fluid within the chamber 206, the jet actuator 200 is able to maintain the momentum of the fluid flow 217 in subsequent strokes of the piston 208.

Figure 18A:
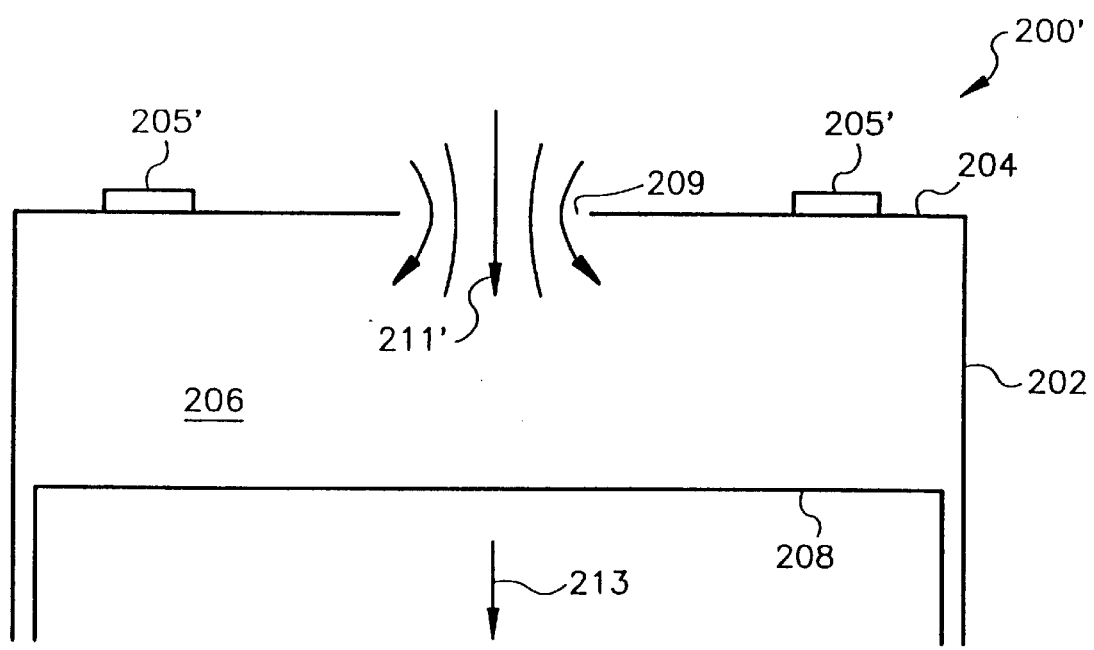
FIG. 18A is a schematic cross-sectional side view of a synthetic jet actuator having a pair of inwardly-opening louvers placed in a closed position while a piston moves toward an orifice.
Figure 18B:
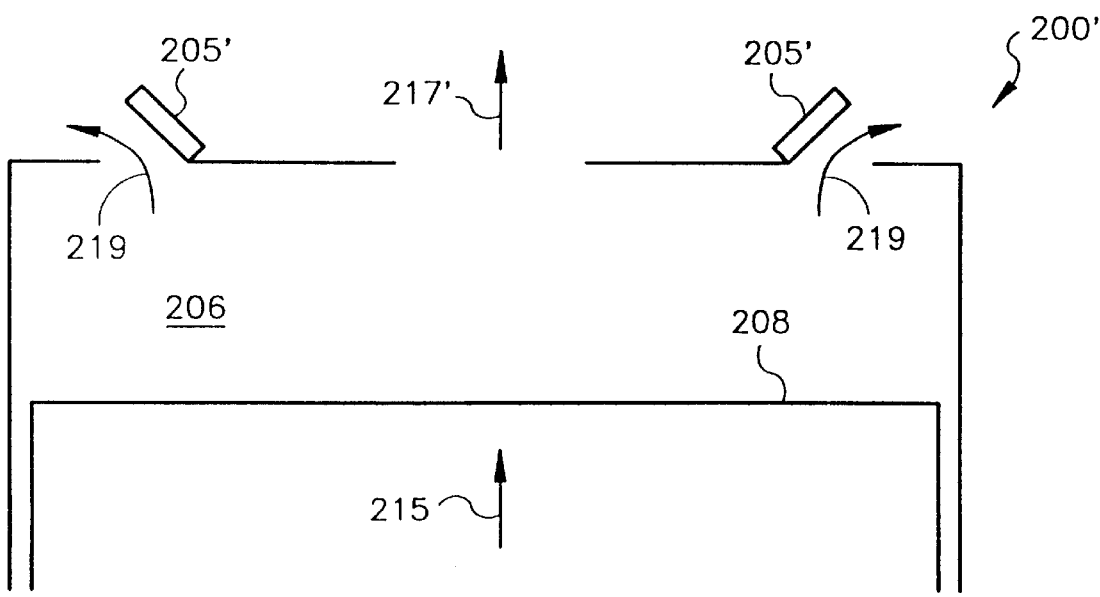
FIG. 18B is a schematic cross-sectional side view of the synthetic jet actuator of FIG. 18A illustrating the louvers in an open position while the piston moves away from the orifice.

In some applications, a fluid flow with larger momentum 211 into the chamber 206 of the jet actuator 200 and a smaller flow out of the orifice 209 may be desirable. FIGS. 18A and 18B illustrate a jet actuator 200' which has a plurality of louvers 205'which become opened while the piston 208 moves toward the orifice 209 and become closed while the piston 208 moves away from the orifice 209. As a result, during the down stroke of the piston 208, as shown in FIG. 18A, a large fluid flow 211' is forced through the orifice 209. During the up stroke of the piston 208, on the other hand, the louvers 205' become opened and fluid is permitted to exit the chamber 206 not only through orifice 209 in flow 217' but also through the openings adjacent louvers 205' in flows 219. Since the fluid has a greater surface area in which to exit the chamber 206, the momentum of the flow 217' is substantially decreased.

As should be apparent from FIGS. 17A, 17B, 18A, and 18B, the amount of fluid that is drawn into the chamber 206 or which is forced out of the chamber 206 may be altered by using one or more louvers. With the jet actuator 200, the louvers 205 increase the amount of fluid that enters the chamber 206 while the louvers 205' in jet actuator 200' decrease the momentum of the jet 217' exiting the orifice 209. By adjusting the size and number of the openings covered by the plurality of louvers, the flow rates in and out of the chamber 206 may be altered.

1. Alternate Types of Louvers

The louvers in a synthetic jet actuator are one-way valves that permit fluid flow in one direction but which block flow in the opposite direction. As shown above in synthetic jet actuators 200 and 200', the louvers can permit fluid flow either into the chamber 206 or out of the chamber 206. The invention can be implemented with any suitable type of louver, such as either an active louver or a passive louver. A passive louver is simply a flap or valve which is hinged so as to open with fluid flow in one direction and which closes tight against the housing 202 of the jet actuator with fluid flow in the opposite direction.

An active louver, such as louver 230 shown in FIGS. 20A and 20B, becomes opened or closed with the assistance of a force other than just the force of a fluid flow. In the example shown in FIGS. 20A and 20B, this other force may be generated by a piezo-electric material 232. With reference to FIG. 20A, when the louver 230 is in a closed state, a semi-rigid member 234 is in intimate contact with wall 204 of the synthetic jet actuator. The semi-rigid member 234 preferably overlaps a portion of the wall 204 so that the louver 230 remains in a closed state even when a fluid flow 236 contacts the louver 230. As is known to those skilled in the art, the piezo-electric material 232 will deflect upon the application of an electrical signal. Thus, an electrical signal can be applied to the piezo-electric material 232 from a signal generator 239 to cause the piezo-electric material to deflect down to an open state shown in FIG. 20B. In the open state, a fluid flow 238 is permitted to travel through an opening 235 and exit the chamber or, as depicted in this example, enter the chamber. The exact manner in which an electrical signal is applied to the piezo-electric material 232 is known to those skilled in the art and, accordingly, has been omitted from the drawings in order to simplify the description of the invention.

Figure 31:
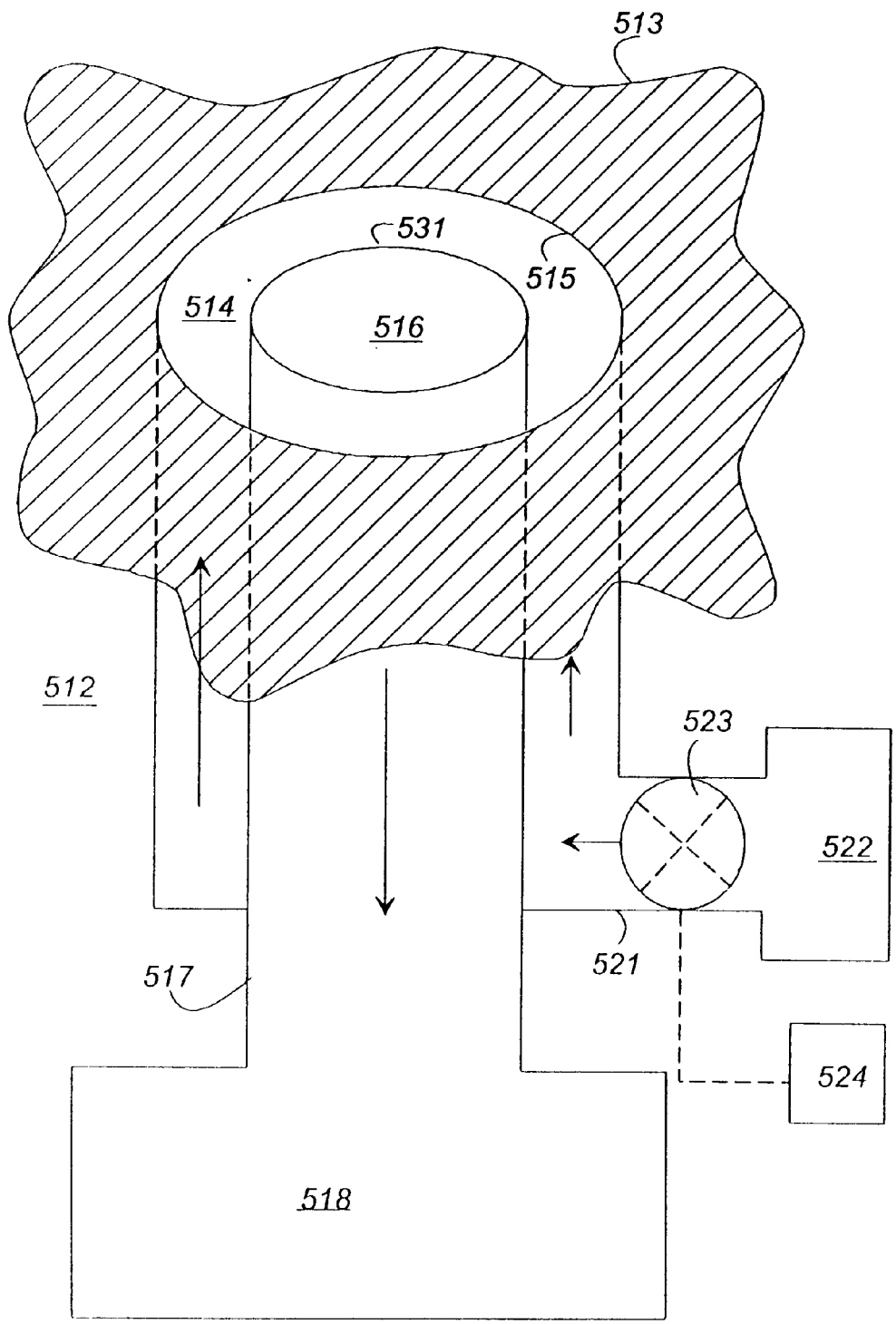
FIG. 31 is a cut-away perspective view of a second embodiment of a synthetic jet producing device

C. Second Preferred Embodiment For Synthetic Jet Actuators: Constant Suction Synthetic Jet Actuator The preferred embodiment for a constant suction synthetic jet actuator 511, a further improvement on the class of synthetic jet actuators, is depicted in FIG. 31. A constant suction synthetic jet 511 is particularly useful for the application of embedding a synthetic jet actuator into a solid body 512.

The preferred embodiment 511 is comprised of an outer cylindrical section 514 made similar to a pipe, and an inner cylindrical section 516. Although not limited to such an embodiment, the outer cylindrical section 514 and the inner cylindrical section 516 as depicted in FIG. 31 are concentric and approximately perpendicular to the outer surface 513 of the solid body 512. Additionally, the outer cylindrical section 514 is embedded into the solid body 512 such that an upper rim 515 of the outer section is contiguous with the outer surface 513. By contrast, the inner cylindrical section 516 has an upper rim 531 which is some small distance below the outer surface 513 of the solid body 512. The particular diameters given to the outer cylindrical section 514 and the inner cylindrical section 516 are not critical to the present invention.

The outer cylindrical section 514 should preferably be connected by fluidic piping 521 to a fluid source 522. Along the path of the fluidic piping 521 is a valve 523 which permits control of the fluid flow through the fluidic piping 521. The present invention, however, is not intended to be limited to the use of a valve 523 only. Any equivalent mechanism for stopping and restarting the flow of fluid would also function adequately and is included in the present invention.

In operation, the valve 523 should preferably alternately stop and then release fluid through the fluidic piping 521 and into the outer cylinder 514. This "on-off" operation is controlled by a suitable control system 524, such as a microcomputer or other logic device. The frequency at which the control system 524 causes the gate valve 523 to operate should preferably be adjustable in order to control effectively the operation of the synthetic jet actuator. A computer control system would easily provide this level of control.

The inner cylindrical section 516 is preferably connected by fluidic piping 517 to a suction mechanism 518. Such a suction mechanism 518 may comprise a vacuum, a pump, or any other appropriate mechanism for providing a constant suction. As indicated by the name of this preferred embodiment, the suction mechanism 518 operates constantly during operation of the synthetic jet actuator 511 and the removed fluid can be pumped back into the blowing section.

Figure 32A:
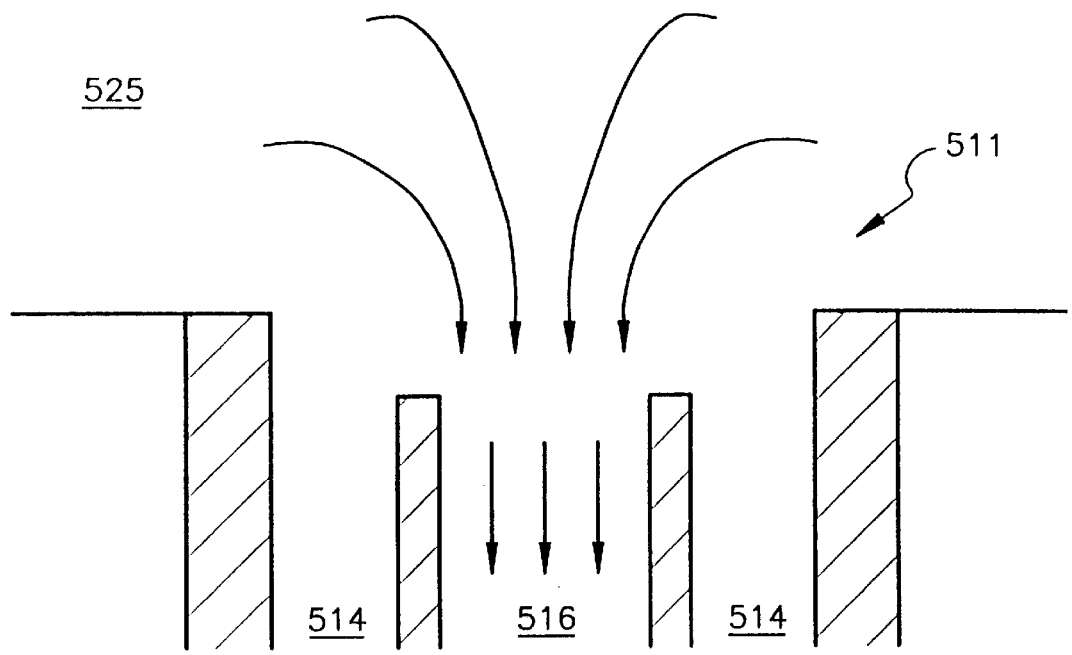
FIG. 32A is a schematic side-view of a second embodiment of a synthetic jet producing device in a first mode of operation where fluid is drawn in through the embodiment.

Therefore, in operation, the suction mechanism 518 creates a constant suction on an ambient fluid 524 above the outer surface 513 of the solid body 512. This action creates a constant flow of the ambient fluid 525 into the inner cylindrical section 516 and through the fluidic piping 517. The operation of the constant suction synthetic jet 511 when ambient fluid 525 is being pulled into the inner cylindrical section 516 is depicted in FIG. 32A. In FIG. 32A, the gate valve 523 is closed such that no fluid is ejected through the outer cylindrical section 514. This particular mode of operation is very much like the synthetic jet actuator 10 of FIGS. 1A–1C when the diaphragm or piston withdraws from the housing 11, thereby increasing the volume of the chamber 14.

Figure 32B:
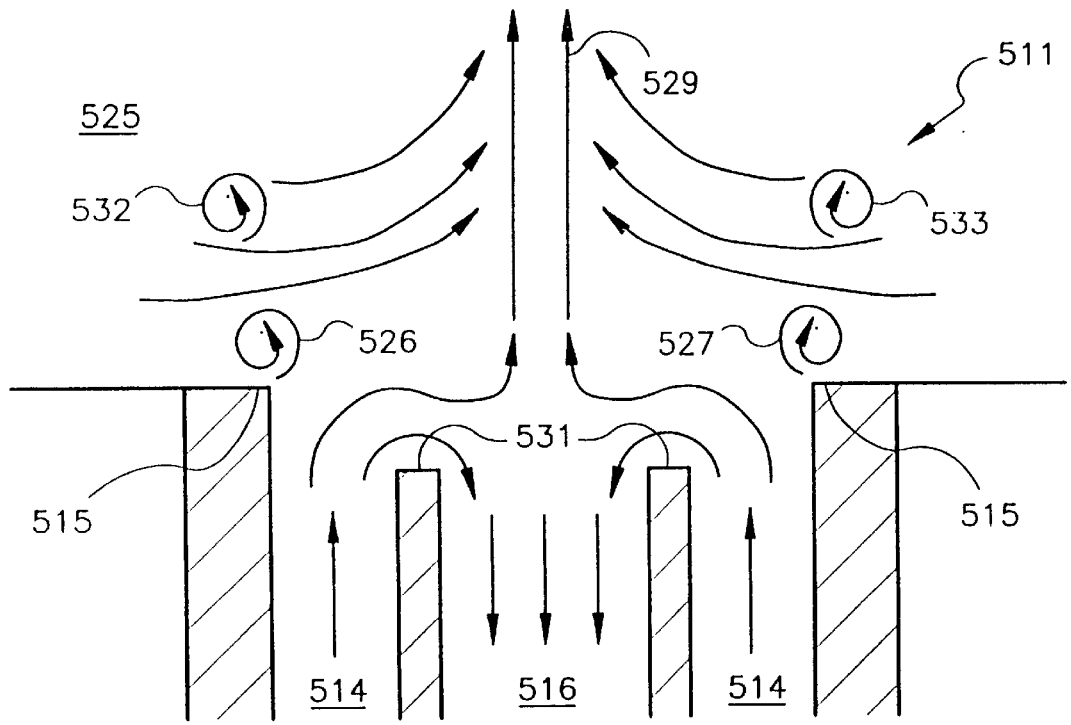
FIG. 32B is a schematic side-view of a second embodiment of a synthetic jet producing device in a second mode of operation which produces a synthetic jet stream.

FIG. 32B depicts a mode of operation of the constant suction synthetic jet 511 when the gate valve 523 is opened and fluid flows out through the outer cylindrical section 514. As the fluid goes by the upper rim 515 of the outer cylindrical section 514, vortices 526, 527 are formed, roll up, and move away. Vortices 532, 533, as depicted in FIG. 32B, have already moved a small distance away from the outer surface 513 of the body 512. The vortices 526, 527, 532, 533 entrain ambient fluid 525, as depicted by arrows 528a–528d. Thus, a synthetic jet actuator of fluid 529 is formed approximately normal to the outer surface 513 and moves away from the solid body 512.

Since the upper rim 531 of the inner cylindrical section 516 is slightly below the outer surface 513 of the solid body 512, as fluid is ejected from the outer cylindrical section 514, some of the fluid will be pulled around the upper rim 531 of the inner cylinder 516 and into the fluidic piping 517, as depicted in FIG. 32B. However, because this occurs below the outer surface 513 of the solid body 512, the formation of the vortices 526, 527 and the resulting fluid jet 529 is not affected by the constant suction.

The constant suction synthetic jet actuator 511 alternates between the mode of operation depicted in FIG. 32A and the mode of operation depicted in FIG. 32B. However, as descried above with regard to the synthetic jet actuator 10 depicted in FIGS. 1A–1C, a constant jet of fluid 529 is formed above the opening in the outer surface 513 of the solid body 512.

If it is desired, the fluid source 522 for the outer cylindrical section 514 can be a storage container into which fluid from the ambient air 525 is deposited after being drawn through the inner cylinder 516 by the suction mechanism 518. In this way, zero net mass is injected into the system. This feature may be desirable in some applications. However, the present invention is not limited to such a configuration. Where it does not matter whether any mass is ejected into the system, the source of fluid 522 for the outer cylinder 514 can be any fluidic chamber or environment. In this way, the net mass flow into or out of the synthetic jet actuator of this preferred embodiment can be tailored for the specific application.

The features and operation of synthetic jet actuators with louvers and constant suction synthetic jet actuators are described in detail in patent application Ser. No. 08/869,716, filed Jun. 5, 1997, the contents of which are hereby incorporated by reference in this application as if fully set out herein.

II. Synthetic Jet Actuators Cooling Various Heated Fluids and Bodies

The present invention involves a cooling system using the unique characteristics of synthetic jet actuators. All of the below-described cooling systems employ at least a part of the actuator "hardware" described above.

A. Cooling In An Open System

1. Direct Impingement Cooling

Figure 12A:
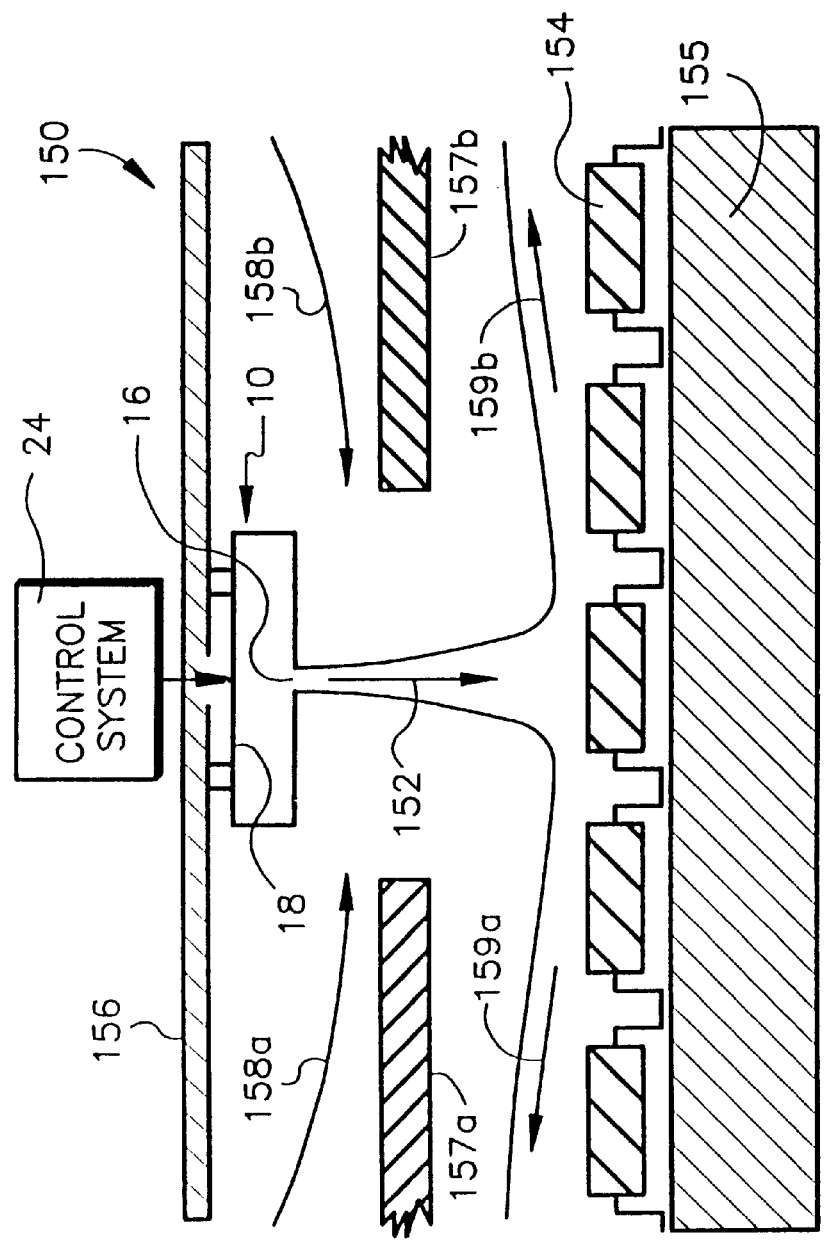
FIG. 12A is a schematic cross-sectional side view of a synthetic jet cooling in an open system having a synthetic jet actuator of FIG. 1A.

A first preferred embodiment 150 for a heat transfer system in an open system is one as depicted in FIG. 12A. This system preferably comprises a synthetic jet actuator 10 directly impinging on a heat-producing object 154 (or area) as depicted in FIG. 12A. Although described here in the context of an open system, the embodiment of FIG. 12A could be employed effectively in a closed system due to the ability of a synthetic jet actuator to create a fluid flow without net mass injection. The construction and functioning of the system described below would not be significantly altered.

The embodiment depicted in FIG. 12A comprises a synthetic jet actuator 10 of the type depicted in FIGS. 1A–1C. However, this is not the only type of device for producing a synthetic jet stream and, therefore, the invention is not limited to such a synthetic jet actuator 10. For example, a constant suction synthetic jet actuator 511 or a synthetic jet actuator with louvers 200 could be used. In the configuration 150 shown in FIG. 12A, the synthetic jet actuator 10 is mounted on a surface 156 opposite to a heat producing body 154. In the preferred embodiment, the heat producing body 154 comprises a computer chip array on a circuit board 155.

As depicted in FIG. 12A, partitions 157a, 157b are preferably positioned between the surface 156 housing the synthetic jet actuator 10 and the heat producing body 154. These partitions 157a & 157b, while only optional and not necessary to the present embodiment, allow more efficient channeling of cool ambient fluid 158a, 158b into the synthetic jet actuator 10 and channeling of heated fluid 159a, 159b away from the heated body 154. In FIG. 12A, the heat producing body 154 is a microchip array; however, any heat producing body or surface can be cooled by the present embodiment. When the diaphragm 18 of the synthetic jet actuator 10 is vibrated by an excitation means 24, such as a piezoelectric element, a fluid flow 152 is produced which propagates from the synthetic jet orifice 16 and impinges on the heated surface 154.

Optimally, the mounting surface 156 can be positioned at a distance of about 16 times the diameter of the synthetic jet orifice from the heat producing body 154. Furthermore, the synthetic jet actuator 10 should be positioned such that the centerline of the flow 152 strikes the center of the heat producing body 154. Although this particular distance from the heat producing body 154 and point of impingement are optimal, other distances and arrangements can be used. The present invention is not intended to be limited to a particular distance from synthetic jet actuator 10 to heat producing body 154. The invention is also not limited to the particular point of impingement of the fluid flow on the heated body 154 (or angle thereof).

Use of a synthetic jet actuator 10 to cool a heated body 154 is a significant advance over mere unassisted convective cooling. Additionally, the heated body 154 is cooled without any net mass injection into the bounded volume system 150.

2. "Clip-on Module"

Figure 12B:
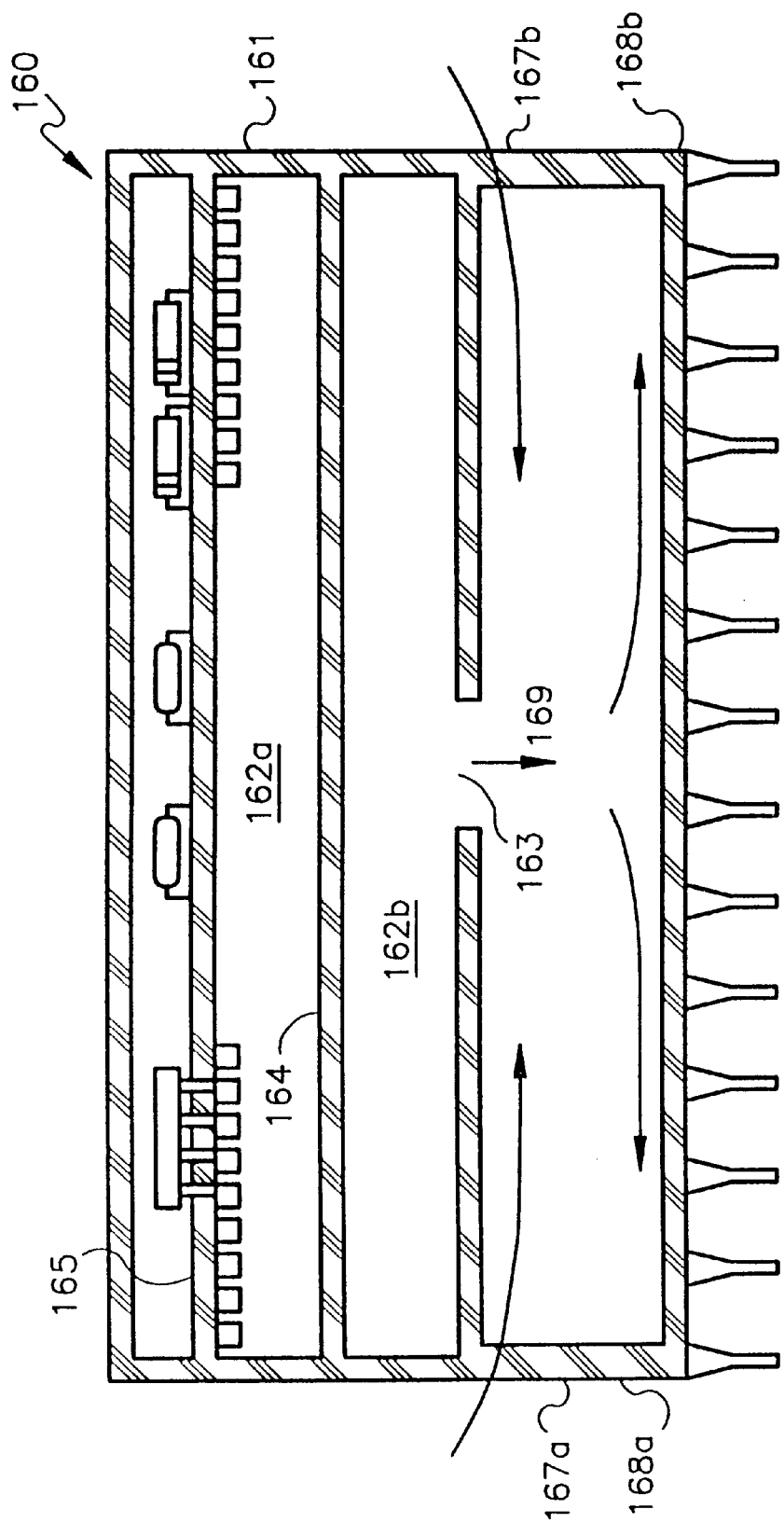
FIG. 12B is a schematic cross-sectional side view of the synthetic jet actuator of FIG. 1A adapted into a portable "clip-on" module for microcomputer cooling applications.

In addition to integration into new electronic hardware, the cooling device generally described above in FIG. 12A can also be designed into a package that can be "clipped" onto electronic boards in an ad hoc fashion. Because such a device could be employed in the field, unforeseen cooling problems for equipment in the field can be repaired on the spot. The preferred embodiment of a "clip-on" module 160 is depicted in FIG. 12B.

Typically, a "clip-on" module 160 will be constructed as a synthetic jet actuator of the style depicted in FIGS. 1A–1C, although the present cooling system is not so-limited. The "clip-on" module provides a compact, inexpensive, and reliable means of cooling. As depicted in FIG. 12B, the preferred embodiment is comprised of a housing 161 defining two interior chambers 162a, 162b. The exterior walls of the housing are substantially rigid and form an orifice 163. An interior wall, parallel to a wall forming the orifice 163, comprises a flexible magnetic membrane 164.

The first, upper chamber 162a preferably houses all of the circuitry 165 required to drive the flexible, magnetic membrane 164 and cause the membrane 164 to vibrate in time-harmonic or periodic motion. In the preferred embodiment, the circuitry 165 drives the membrane 164 by electromagnetic force. Of course, the membrane 164 may alternatively be constructed of any commonly known flexible material and actuated by a simple piezoelectric actuator adhered to the surface of the membrane 164. In fact, many different methods of actuation are possible. Electromagnetic actuation has been chosen only due to typically lower acoustic noise.

Just as with the synthetic jet actuators described above, the motion of the membrane 164 creates a series of vortices emitting from the orifice 163 and forming a synthetic jet stream 169 impinging on a heat-producing body 166 below the orifice 163. The fluid 170a, 170b will then flow along the heat producing body 166 permitting heat transfer from the heat producing body 166 to the fluid stream 170a, 170b. In this way, the heat producing body 166 will be cooled by the synthetic jet actuator 160.

The housing 161 is supported, preferably, by clamp arms 167a, 167b. These are securely attached to the housing 161 by an appropriate attachment mechanism, such as screws or adhesive. Alternatively, the clamp arms 167a, 167b could be formed as a part of the rigid housing 161 walls. The arms 167a, 167b project normal to the wall forming the orifice 163. In that way, the synthetic jet stream produced by the "clip-on" module 160 will travel approximately parallel to the clamp arms 167a, 167b. At the ends of each clamp arm 167a, 167b is an appropriate device 168a, 168b for attaching the module 160 to a circuit board, chip, or other electronic component 166. These attaching devices 168a, 168b will vary depending on the particular use to which the "clip-on" module 160 will be put. However, the attaching devices 168a, 168b should appropriately attach to a circuit board, or pins of a chip, so that power for the "clip-on" module 160, and the circuitry 165 therein, can be derived from the electronic surface 166 to which the device 160 is attached.

3. Channel Cooling

Figure 9A:
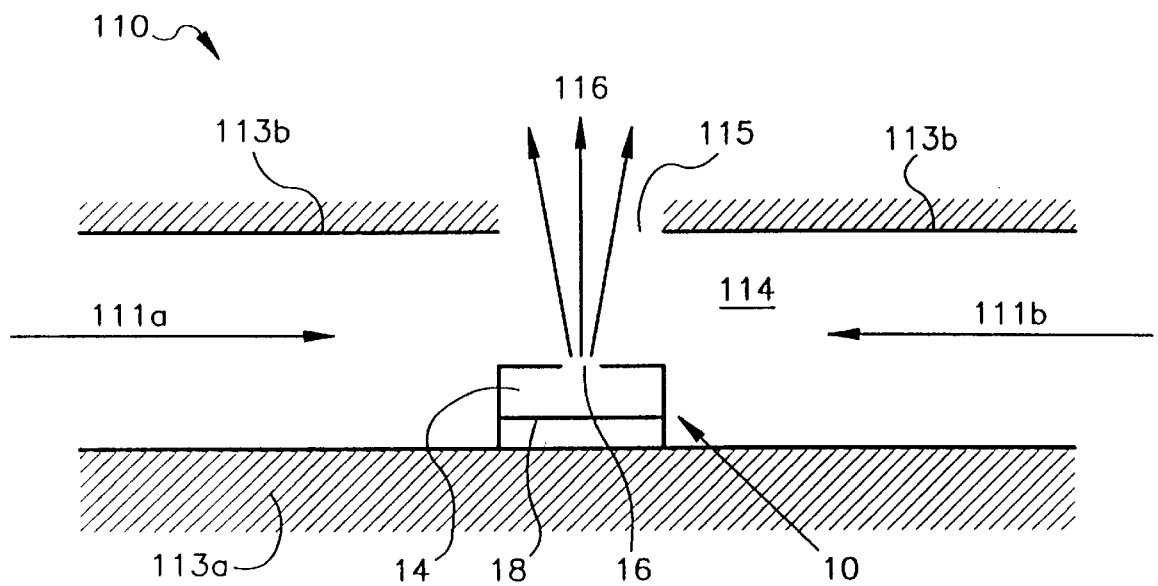
FIG. 9A is a schematic cross-sectional side view of a system wherein the synthetic jet actuator of FIG. 1A creates fluid flow in a channel and ejects the fluid through a port.

A second preferred embodiment of a synthetic jet actuator cooling system involves cooling heated walls of a channel with a synthetic jet. This preferred embodiment 110 of a system for a synthetic jet actuator 10 to cause fluid (depicted by arrows 111a and 111b) from an ambient fluid 112 to travel down the walls 113a & 113b of a channel 114 is depicted in FIG. 9A. In this embodiment 110, a synthetic jet actuator 10 is placed along one of the walls 113a of the channel 114. The wall 113b across from the synthetic jet actuator 10 contains a port 115 approximately across from the orifice 16 of the synthetic jet actuator 10. When functioning, the synthetic jet actuator 10 produces a stream of fluid 116 traveling across the channel 114 and through the port 115.

A synthetic jet actuator 10 is zero net mass in nature and, therefore, must replenish the fluid supply in its chamber 14 from ambient fluid 112 as the synthetic jet actuator diaphragm 18 increases the volume of the synthetic jet chamber 14. A stream of fluid 111a & 111b is created traveling down the channel 114, next to the channel walls 113a & 113b. This process allows the ambient fluid 112 an opportunity to transfer heat energy away from the channel walls 113a & 113b. Additionally, this heated fluid stream 111a & 111b is drawn into the synthetic jet actuator 10 and ejected from the jet 10, through the port 115. In this way, the walls 113a & 113b may be efficiently cooled by the ambient fluid 112 and the heat energy ejected away from these walls 113a & 113b.

Figure 9B:
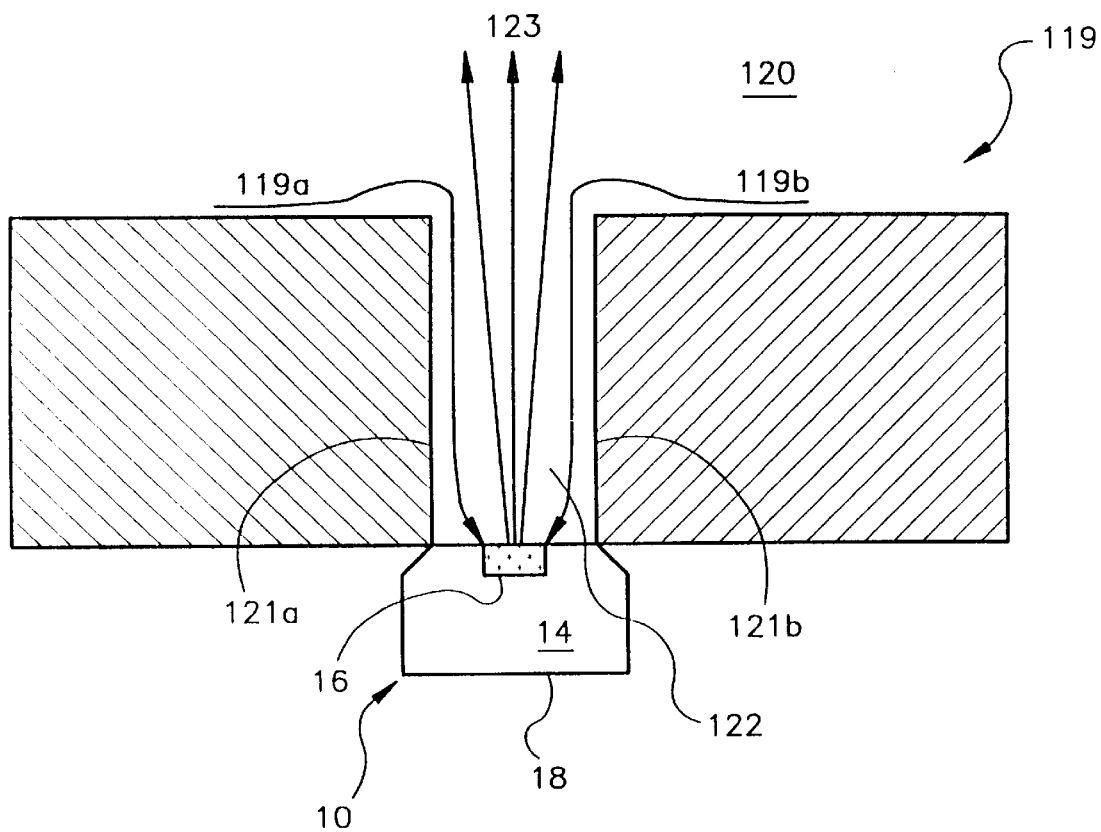
FIG. 9B is a schematic cross-sectional side view of a system wherein a synthetic jet actuator (as depicted in FIG. 1A) is used to create a fluid flow in a channel.
Figure 10:
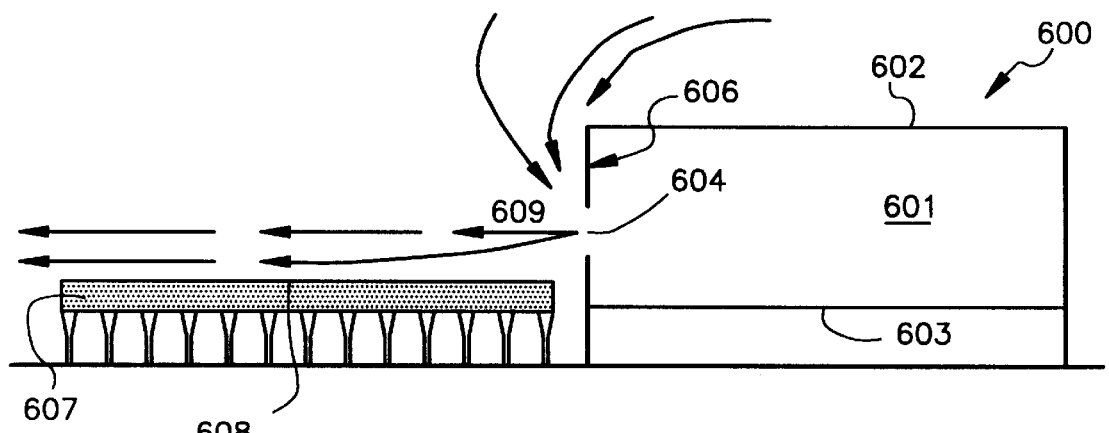

Another, related embodiment of a system for a synthetic jet actuator 10 to cause fluid (depicted by arrows 119a and 119b) from an ambient fluid 120 to travel down the walls 121a & 121b of a channel 122 is depicted in FIG. 9B. In this embodiment, a synthetic jet actuator 10 is placed at the bottom of a channel 122. The channel 122 is bounded by solid walls 121a & 121b. When functioning, the synthetic jet actuator 10 produces a stream of fluid 123 traveling up through the channel 122. A synthetic jet actuator 10 is zero net mass in nature and, therefore, must replenish the fluid supply in its chamber 14 from ambient fluid 120 as the synthetic jet actuator diaphragm 18 increases the volume of the synthetic jet chamber 14. Since a stream of fluid 123 is traveling through the center of the channel 122, the fluid from the ambient fluid field 120 must travel down the channel 122 next to the channel walls 121a & 121b as depicted by arrow 119a and arrow 119b. This process allows the ambient fluid 120 an opportunity to transfer heat energy from or to the channel walls 121a & 121b more effectively than if no synthetic jet 10 were used in the process. Likewise, this technique could be used to coat the channel walls with ions or other particles in a manufacturing process. The walls will be coated more evenly than if no synthetic jet actuator were used in the process.

B. Cooling In A Closed System

FIG. 1A depicts a first preferred embodiment of a general, simple bounded volume synthetic jet heat transfer system 130 in a closed system. This system 130 comprises a housing 131 defining a closed chamber 132. In the preferred embodiment, a rectangularly cubic chamber 132 has been selected. However, any shape of chamber 132 may be defined by said housing 131.

Figure 11:
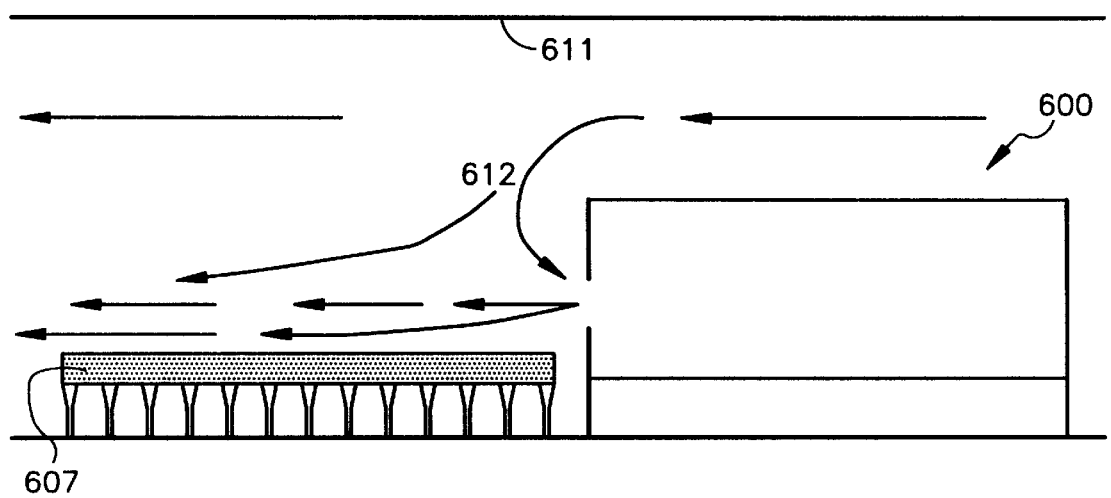
FIG. 11A is a schematic cross-sectional side view of a synthetic jet cooling system having the synthetic jet actuator of FIG. 1A and employed within a bounded volume.
FIG. 11B is a schematic cross-sectional side view of a synthetic jet cooling system having the synthetic jet actuator employed within a bounded volume.
Figure 11A:
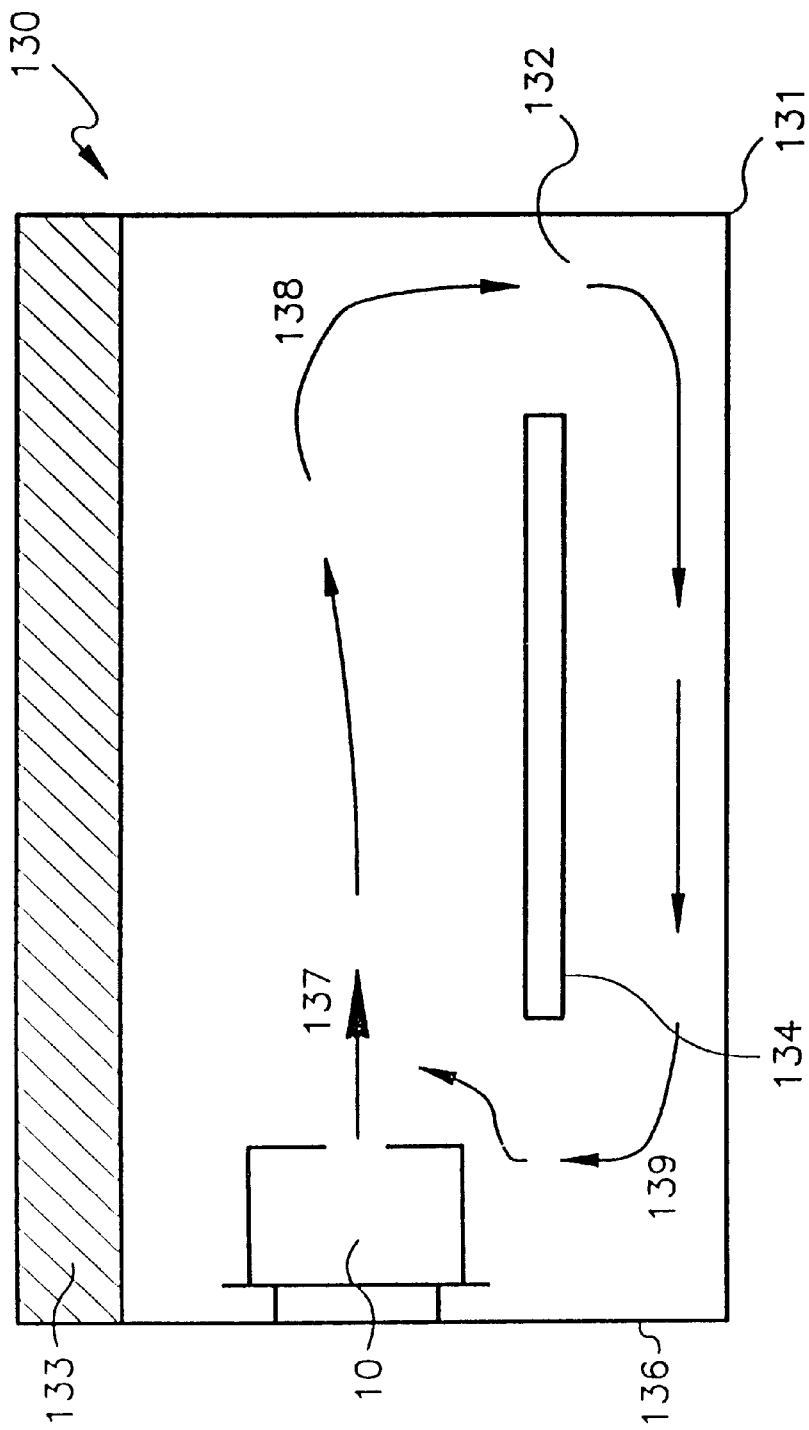

In FIG. 11A, an upper wall of the housing 131 has a heated surface 133. For example, this heated surface 133 could comprise a microcomputer chip array or other device that produces heat as a by-product of functioning. Within the chamber 132, a heat sink surface 134 is placed. This heat sink surface 134 may be completely contained in the chamber 132, or it may protrude out of the chamber 132 through one of the walls of the housing 131 in order to expose this surface 134 to cooler fluid outside of the housing 132. Furthermore, the heat sink surface 134 may be of several different shapes in order to facilitate heat transfer from the fluid to this heat sink surface 134.

A synthetic jet actuator 10 is placed in the chamber 132 against one of the side walls 136 of the housing 131 and positioned such that the fluid flow 137 generated will flow along the heat emitting surface 133. Typically, the chamber 132 will be designed such that the synthetic jet flow 137 can pass completely around the heat sink surface 134 forming a flow cycle, depicted in FIG. 11A by arrow 138 and arrow 139.

As the jet 137 passes the heated surface 133, the strong turbulence of the flow 137 draws heated fluid directly adjacent to the heated surface 133 into the stream of fluid 137. The jet stream 137 mixes the fluid quite well due to the strong entrainment and strong turbulence inherent to a synthetic jet flow 137. This mixing will allow some of the heated fluid drawn away from the heated surface 133 to deposit some of the its heat into the heat sink surface 134. However, because the flow 137 can cycle around the chamber 132, as depicted by arrows 138 and 139, the heat will be given even more time to transfer to either the heat sink surface 134 or a cooler wall of the housing 131.

1. Low-Profile Design

Figure 11B:
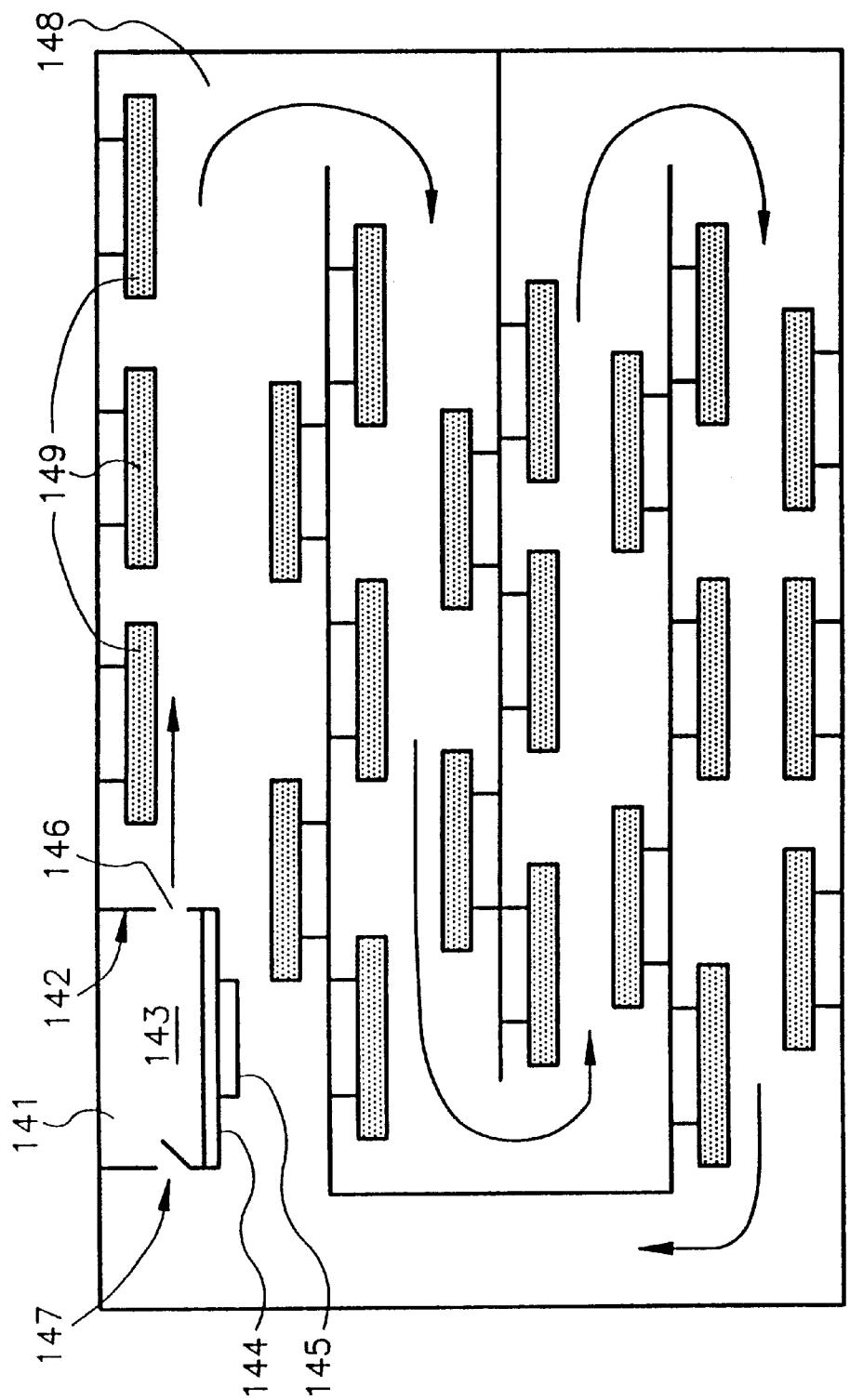

Another preferred embodiment of the synthetic jet circulation system for a closed volume depicted in FIG. 11A is shown in FIG. 11B. The preferred embodiment 140 shown in FIG. 11B also causes a fluid flow over a heat producing surface or heated body 149; however, the construction of the synthetic jet actuator 141 is slightly modified to present a "low-profile" synthetic jet actuator module 141. Note that the container in FIG. 11B is designed to circulate the synthetic jet flow.

The device depicted in FIG. 11B depicts a simple configuration for low profile synthetic jet actuator 141. This actuator 141 comprises a housing 142 defining a chamber 143 wherein one wall is a flexible membrane 144. This flexible membrane 144 can be driven in any of the means described in the first preferred embodiment; however, the preferred embodiment is driven by a piezoelectric actuator 145 attached adhesively to an exterior surface of the membrane 144.

Additionally, and distinct from the previous embodiments discussed, the orifice 146 out of which vortices will be shed is not formed in a housing wall directly opposite the flexible membrane 144. Instead, the orifice 146 is formed on one of the side walls of the housing 142 directly adjacent to a heat producing body 149.

If desired, a louver 147 may be added in any if the other side housing walls The louver 147 may be of the type described above in the second preferred embodiment. Most often, the louver 147 will be a one way louver 147 permitting only flow into the interior chamber 143 of the synthetic jet actuator 141. In this way, the low profile synthetic jet actuator 141 simulates a type of pump and creates circulation throughout the bounded volume 148, and, particularly, across the surface of the heated body 149.

Figure 35:
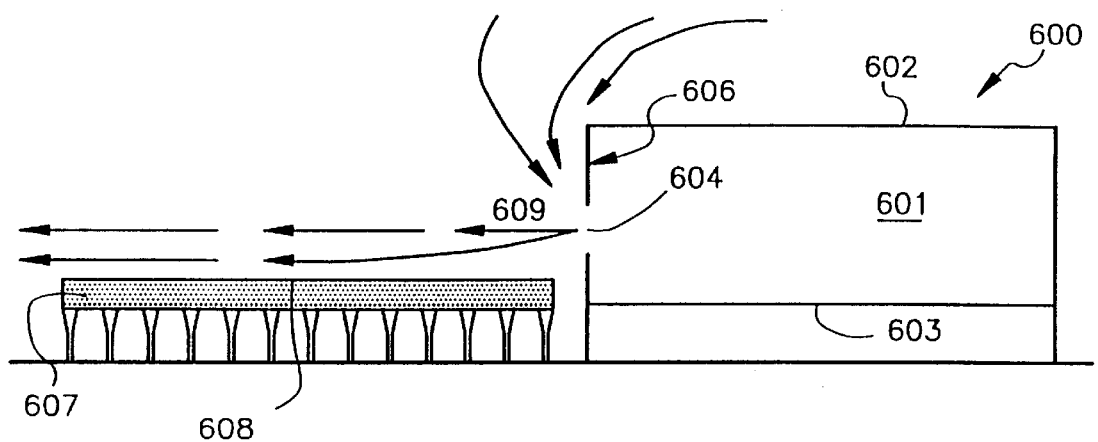
FIG. 35 is a schematic side view of a "low profile," side-blowing synthetic jet actuator cooling apparatus.

Another embodiment of a low-profile cooling actuator 600 is depicted in FIG. 35. This actuator 600 is designed to take advantage of the strong entrainment of synthetic jets and their tendency to become attached to solid surfaces. The actuator 600 comprises a shallow cylindrical cavity 601 bounded on top 602 and bottom 603 by flexible membranes. The actuator 600 further comprises an orifice 604 on a side wall 606 spanning between the top membrane 602 and the bottom membrane 603. Of course, as with previous embodiments of synthetic jet actuators, the actuator 600 may be designed with only one membrane.

As depicted in FIG. 35, the actuator 600 is preferably situated adjacent to a heat-producing body, such as an integrated circuit 607. Although the present invention is not so-limited, the orifice 604 of the actuator 600 comprises a slot in the preferred embodiment. This slot 604 is manufactured to have substantially the same width as the integrated circuit 607 and is situated slightly above the surface 608 of the integrated circuit 607 so that a fluid jet 609 attaches to and flows along the entire surface 608. In this manner, the heated integrated circuit 607 will be very effectively cooled by the fluid jet 609.

Figure 36:
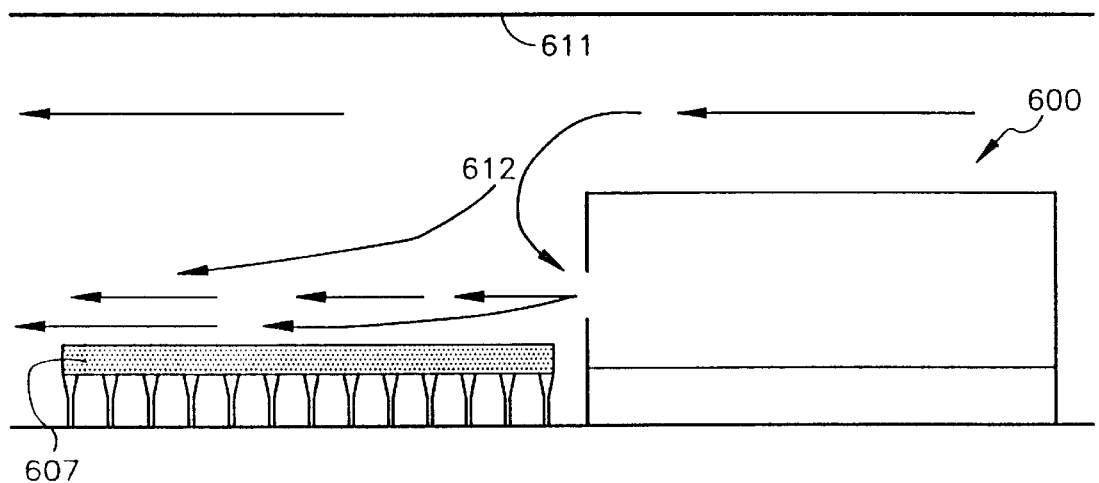
FIG. 36 is the apparatus of FIG. 35 bounded by an upper wall and depicting the enhanced fluid entrainment.

While FIG. 35 generally depicts an open system, FIG. 36 depicts the actuator 600 situated adjacent to the integrated circuit 607 and bounded above by a solid wall 611. Such a closed system configuration strengthens the entrainment of the actuator 600, as depicted by arrows 612. When used in a closed system, the actuator 600 increases a circulation of fluid within a sealed volume and permits more effective cooling of the integrated circuit 607. Of course, if the actuator 600 is employed in an open system, the actuator 600 would entrain global flow from another cooling device, such as a fan. In an open system, efficient local cooling contributes to a substantial reduction in the total volume of flow needed from a global fan to achieve the same cooling, thus contributing to a substantial reduction in overall system noise and dust.

Figure 37:
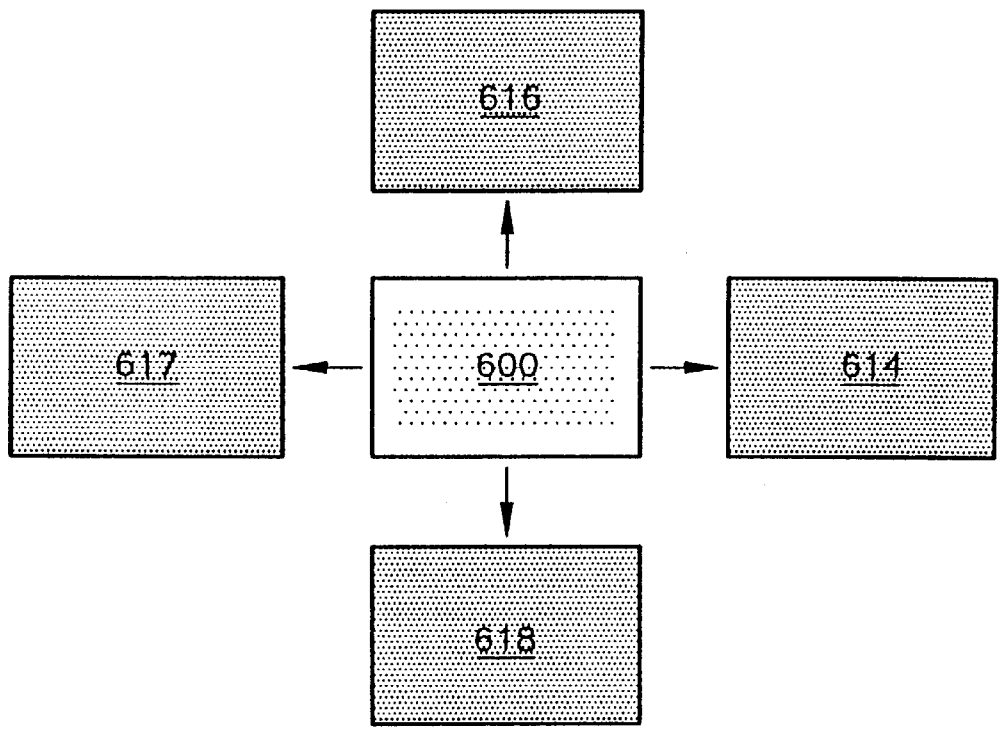
FIG. 37 is the apparatus of FIG. 35 adapted to cool multiple heated bodies simultaneously.
Figure 38:
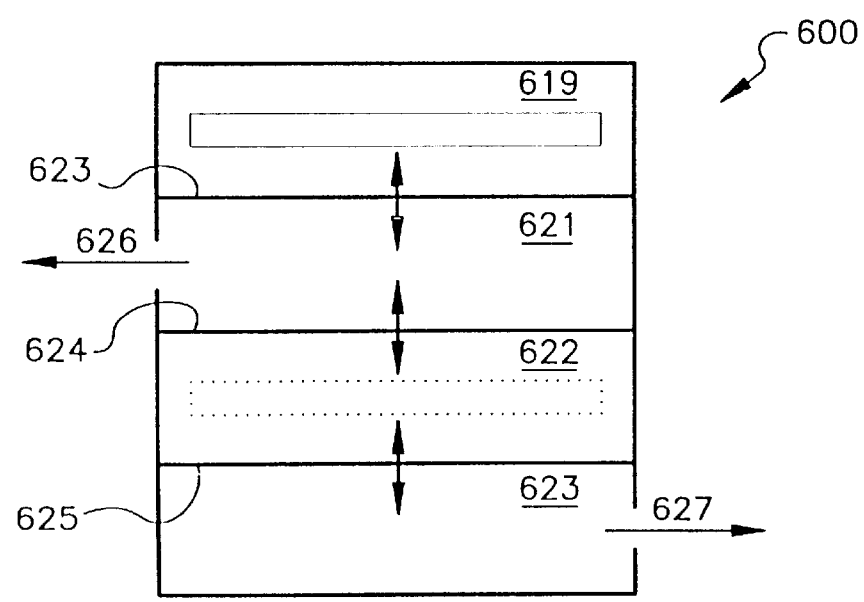
FIG. 38 is a schematic side view of a specially adapted apparatus for cooling multiple heated bodies simultaneously.

An important enhancement of the "low-profile" actuator 600 is that it can cool a number of integrated circuits 614, 616, 617, 618 simultaneously as shown in FIG. 37 when configured with multiple slots. Furthermore, the actuator 600 can be assembled so that it forms a "stack" of several synthetic jet actuator cooling modules 619, 621, 622, 623. See FIG. 38. Each module 619, 621, 622, 623 blows fluid in a different direction. In this manner, membranes 623, 624, 625 mounted between adjacent compartments can be used to form four fluidic jets (only to are shown in FIG. 38), 626, 627 simultaneously. Notice that the "blowing" and suction cycles of adjacent actuators depicted in FIG. 38 will be necessarily out of phase.

In addition to the embodiments described above for closed systems, a "clip on" module as depicted in FIG. 12B could also be used effectively in a closed system. There would typically be no difference in design or implementation as from the device described above.

We claim:

1. A portable module for cooling a heated body source in a bounded volume comprising:

(a) a housing defined by walls forming an internal chamber, one of said walls having an orifice therein;

(b) an interior membrane attached to said housing walls and bisecting the chamber into a control chamber and a jet chamber, the orifice connecting said jet chamber to an external environment having an ambient fluid;

(c) control circuitry causing periodic motion of said membrane such that;

(d) a synthetic jet stream produced from the orifice by the motion of said membrane, said synthetic jet stream impinging on the heated body; and (e) clamping arms connected at a first end to said housing and at a second end to a surface near the heated body said clamping arms providing power to said control circuitry and securing the portable module relative to the heated body.

2. A method for cooling a heated body, comprising the steps of:

provid ing a synthetic jet actuator, said actuator having an orifice;

drawing an ambient fluid into said synthetic jet actuator through the actuator orifice;

generating a series of fluid vortices at an orifice of the synthetic jet actuator by forcing the ambient fluid out of said synthetic jet actuator, said vortices forming vortex sheets emanating from the orifice;

forming a synthetic jet stream with the vortex sheets by entraining a fluid external to the synthetic jet actuator; and directing the synthetic jet stream of fluid such as to flow adjacent to the heated body.

3. The method of claim 2, wherein said step of directing comprises directing the synthetic jet stream to directly impinge on the heated body.

4. The method of claim 2, wherein said step of directing comprises directing the synthetic jet stream to flow across the heated body.

5. The method of claim 3 or claim 4, wherein the step of drawing an ambient fluid into the synthetic jet actuator comprises moving a flexible diaphragm within the synthetic jet actuator such that the volume of a synthetic jet actuator enclosure has a periodically changing volume.

6. The method of claim 3 or claim 4, wherein the step of drawing an ambient fluid into the synthetic jet actuator comprises reciprocating a piston within the synthetic jet actuator such that a volume of a synthetic jet actuator enclosure has a periodically changing volume.

7. A cooling system comprising:

(a) a volume of fluid bounded by walls, said walls prohibiting mass transfer into or out of said volume so that the mass of fluid in said volume does not change;

(b) a heated body in said volume; and (c) a synthetic jet actuator situated within said volume, said synthetic jet actuator emitting a synthetic jet stream directed at said heated body in order to transfer heat from said heated body.

8. The system of claim 7, wherein said synthetic jet actuator comprises:

(a) a jet housing defined by walls, said jet housing having an internal chamber with a volume of fluid and an opening in said jet housing connecting said chamber to an external environment having said fluid; and (b) a volume changing means for periodically changing said volume within said internal chamber so that vortex sheets are generated, forming a series of fluid vortices, said fluid vortices projected into said external environment from said opening of said jet housing.

9. The system of claim 8, wherein said synthetic jet actuator further comprises at least one louver attached to said housing and aligned with an opening in said housing, wherein said one louver permits fluid flow in only one direction either into said chamber or out of said chamber whereby said one louver is a one-way valve.

10. The system of claim 8, wherein said volume changing means comprises a flexible membrane moving in periodic motion such as to change said volume.

11. The system of claim 7, further comprising heat energy adjacent a first internal surface of said bounded volume that is transferred by said fluid flow to a second internal surface of said bounded volume.

12. The system of claim 7, wherein said synthetic jet actuator is situated such that said synthetic jet stream directly impinges upon said heat source.

13. The system of claim 7, wherein said synthetic jet actuator is situated such that said synthetic jet stream passes over said heat source, said synthetic jet stream causing heat energy to transfer away from said heat source.

14. A heat transfer system including a synthetic jet actuator for cooling a heated environment, said actuator comprising:

a housing defined by walls, said housing having an internal chamber with a volume of ambient gas therein, one of the housing walls having an opening for fluid communication between the internal chamber and an external environment of ambient gas; and a means for generating vortex sheets of ambient gas at the opening of the internal chamber, the vortex sheets projecting into the external environment and forming a synthetic jet stream, wherein the synthetic jet stream is directed toward the heated environment in order to cool the heated environment.

15. The synthetic jet actuator of claim 14, wherein said generating means comprises a piston positioned in said jet housing to move so that the ambient gas is moved in and out of the opening during reciprocation of said piston.

16. The synthetic jet actuator of claim 14, wherein said generating means comprises:

a flexible membrane forming a portion of one of said jet housing walls; and a means for moving said flexible membrane in periodic motion, wherein the volume of said housing is periodically modified.

17. The synthetic jet actuator of claim 16, wherein said moving means comprises a vibrating piezoelectric element attached to said flexible membrane.

* * * * *